US012653068B2

(12) United States Patent
Nakagawa et al.

(10) Patent No.: US 12,653,068 B2
(45) Date of Patent: Jun. 9, 2026

(54) METHOD FOR PRODUCING A LIGHT EMITTING DIODE SUPPLY SUBSTRATE, METHOD FOR PRODUCING A LIGHT EMITTING DIODE DISPLAY, METHOD FOR PRODUCING A DIVISION UNIT FOR A LIGHT EMITTING DIODE DISPLAY, AND METHOD FOR PRODUCING A DEVICE SUPPLY SUBSTRATE

(71) Applicant: SHIN-ETSU CHEMICAL CO., LTD., Tokyo (JP)

(72) Inventors: Hideo Nakagawa, Omihachiman (JP); Yoshinori Ogawa, Kamakura (JP); Nobuaki Matsumoto, Takasaki (JP); Kazunori Kondo, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 476 days.

(21) Appl. No.: 18/031,735

(22) PCT Filed: Sep. 27, 2021

(86) PCT No.: PCT/JP2021/035465
§ 371 (c)(1),
(2) Date: Apr. 13, 2023

(87) PCT Pub. No.: WO2022/091670
PCT Pub. Date: May 5, 2022

(65) Prior Publication Data
US 2023/0387084 A1     Nov. 30, 2023

(30) Foreign Application Priority Data
Oct. 30, 2020     (JP) ................................. 2020-182746

(51) Int. Cl.
*H01L 21/683* (2006.01)
*H01L 21/66* (2006.01)
(Continued)

(52) U.S. Cl.
CPC ...... *H01L 25/0753* (2013.01); *H01L 21/6835* (2013.01); *H01L 22/22* (2013.01);
(Continued)

(58) Field of Classification Search
CPC . H01L 25/0753; H01L 21/6835; H01L 22/22; H01L 2221/68368;
(Continued)

(56) References Cited

U.S. PATENT DOCUMENTS

| | | | |
|---|---|---|---|
| 7,378,288 B2 * | 5/2008 | Tran | B23K 26/40 257/E21.526 |
| 7,943,941 B2 | 5/2011 | Shimizu et al. | |

(Continued)

FOREIGN PATENT DOCUMENTS

| | | |
|---|---|---|
| CN | 105518877 A | 4/2016 |
| CN | 107731864 A | 2/2018 |

(Continued)

OTHER PUBLICATIONS

Jun. 19, 2024 Office Action issued in Korean Patent Application No. 10-2023-7012549.

(Continued)

*Primary Examiner* — Vu A Vu
(74) *Attorney, Agent, or Firm* — Oliff PLC

(57) ABSTRACT

A method for producing a light emitting diode supply substrate for transferring a plurality of light emitting diodes to a supply destination, including: a first mounting step of mounting a plurality of light emitting diodes on a supply substrate; a selective removal step of selectively removing defective light emitting diodes on the supply substrate, and (Continued)

a second mounting step of transferring a normal light emitting diode to a position where the defective light emitting diode has been arranged on the supply substrate. Thus, a method produces a light emitting diode supply substrate capable of producing a light emitting diode supply substrate capable of transferring a plurality of normal light emitting diodes to a supply destination.

15 Claims, 7 Drawing Sheets

(51) Int. Cl.
  H01L 25/075 (2006.01)
  H10H 20/01 (2025.01)
(52) U.S. Cl.
  CPC ............... *H01L 2221/68368* (2013.01); *H01L 2221/68386* (2013.01); *H10H 20/018* (2025.01)
(58) Field of Classification Search
  CPC ......... H01L 2221/68386; H01L 25/167; H01L 2221/68381; H01L 24/97; H01L 24/799; H01L 24/98; H01L 2224/80224; H01L 2924/12041; H10H 20/018; H10H 20/01; H10H 20/85; B23K 26/36; G01R 31/2635; G09F 9/33
  USPC .......................................................... 438/16
  See application file for complete search history.

(56) References Cited

U.S. PATENT DOCUMENTS

| | | | | |
|---|---|---|---|---|
| 8,822,141 | B1 * | 9/2014 | Farooq .................. | H01L 23/544 |
| | | | | 430/323 |
| 9,555,644 | B2 | 1/2017 | Rogers et al. | |
| 10,607,877 | B2 * | 3/2020 | Lee ................... | H01L 21/67271 |
| 10,902,770 | B2 * | 1/2021 | Iguchi .................... | H10D 86/60 |
| 10,985,046 | B2 * | 4/2021 | Paranjpe ............. | H01L 21/6835 |
| 11,515,444 | B2 * | 11/2022 | Sang ................... | H01L 25/0753 |
| 2002/0064032 | A1 | 5/2002 | Oohata | |
| 2002/0115265 | A1 | 8/2002 | Iwafuchi et al. | |
| 2008/0108171 | A1 | 5/2008 | Rogers et al. | |
| 2012/0315710 | A1 * | 12/2012 | Hozawa .................. | H01L 22/20 |
| | | | | 438/109 |
| 2013/0078555 | A1 | 3/2013 | Orihara et al. | |
| 2017/0186730 | A1 * | 6/2017 | Shen ....................... | H01L 24/32 |
| 2017/0263811 | A1 | 9/2017 | Zou et al. | |
| 2017/0278734 | A1 | 9/2017 | Zou et al. | |
| 2018/0358339 | A1 | 12/2018 | Iguchi | |
| 2018/0374738 | A1 | 12/2018 | Lee et al. | |
| 2019/0157523 | A1 | 5/2019 | Hong | |
| 2019/0181122 | A1 * | 6/2019 | Hsu .................... | H01L 25/0753 |
| 2020/0185565 | A1 | 6/2020 | Chen et al. | |
| 2020/0227468 | A1 | 7/2020 | Miyagoshi et al. | |
| 2021/0005520 | A1 * | 1/2021 | Ishio .................... | H05K 13/082 |
| 2022/0033690 | A1 | 2/2022 | Otake et al. | |
| 2022/0124949 | A1 | 4/2022 | Nakagawa et al. | |
| 2022/0223754 | A1 * | 7/2022 | Ahn ........................ | H10D 86/00 |
| 2022/0277983 | A1 | 9/2022 | Kim et al. | |
| 2023/0127225 | A1 * | 4/2023 | Kim ..................... | H10H 20/856 |
| | | | | 257/91 |

FOREIGN PATENT DOCUMENTS

| | | | |
|---|---|---|---|
| JP | 2002-118124 | A | 4/2002 |
| JP | 2002-185039 | A | 6/2002 |
| JP | 2007-281413 | A | 10/2007 |
| JP | 5319533 | B2 | 10/2013 |
| JP | 2013-254814 | A | 12/2013 |
| JP | 2019-140400 | A | 8/2019 |
| JP | 2020-004478 | A | 1/2020 |
| JP | 2020-096144 | A | 6/2020 |
| JP | 2020-129638 | A | 8/2020 |
| JP | 2020-136650 | A | 8/2020 |
| KR | 2019-0077267 | A | 7/2019 |
| KR | 2019-0099163 | A | 8/2019 |
| TW | 202023091 | A | 6/2020 |
| WO | 2017/028206 | A1 | 2/2017 |
| WO | 2020/116126 | A1 | 6/2020 |

OTHER PUBLICATIONS

Aug. 20, 2024 Decision on Appeal issued in Japanese Patent Application No. 2020-182746.
Oct. 24, 2024 Extended European Search Report issued in European Patent Application No. 21885789.4.
Jan. 22, 2025 Office Action issued in Korean Patent Application No. 10-2023-7012549.
Feb. 18, 2025 Office Action issued in Japanese Patent Application No. 2024-089958.
Meitl et al., "Transfer Printing by Kinetic Control of Adhesion to an Elastomeric Stamp," Nature Materials, 2006, vol. 5, pp. 33-38.
Charipar et al., "Use of an Elastomeric Donor for LIFT of Metal Foils," JLMN—Journal of Laser Micro/Nanoengineering, 2018, vol. 13, No. 2, pp. 85-89.
Nov. 16, 2021 International Search Report issued in International Patent Application No. PCT/JP2021/035465.
May 2, 2023 International Preliminary Report on Patentability issued in International Patent Application No. PCT/JP2021/035465.
Apr. 27, 2025 Office Action and Search Report issued in Chinese Patent Application No. 202180071541.1.
Sep. 19, 2023 Notification of Reasons for Refusal issued in Japanese Patent Application No. 2020-182746.
Oct. 17, 2025 Office Action issued in Taiwanese Application No. 110136686.
Sep. 8, 2025 Office Action issued in Chinese Patent Application No. 202180071541.1.
Nov. 27, 2025 Office Action issued in Chinese Patent Application No. 20218007154.1.
Mar. 3, 2026 Office Action issued in Korean Patent Application No. 2025-7020323.
Apr. 14, 2026 Office Action issued in Japanese Patent Application No. 2025-100725.

* cited by examiner

[FIG. 1]

[FIG. 2]
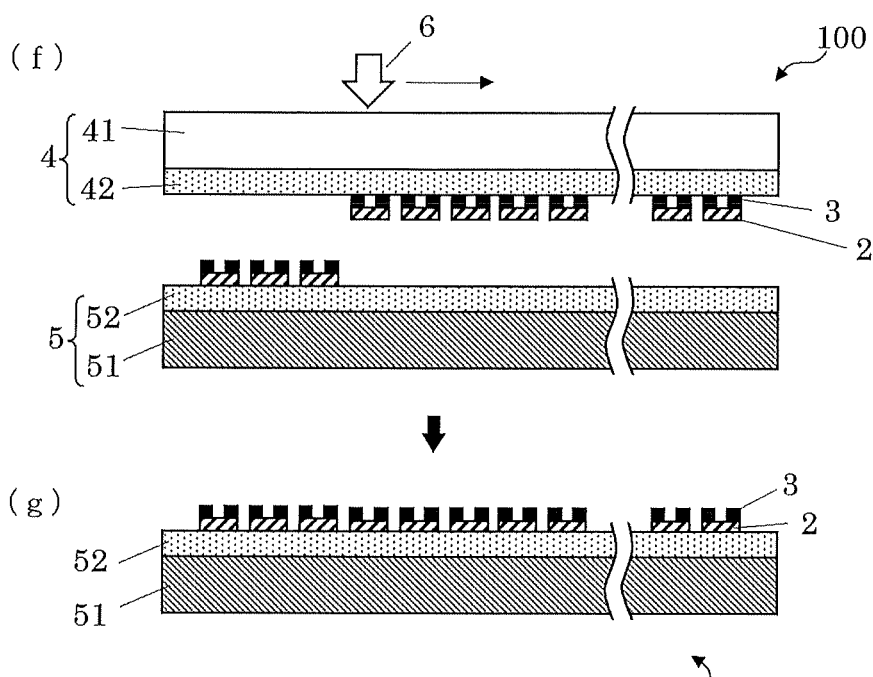
(f)
(g)
[FIG. 3]
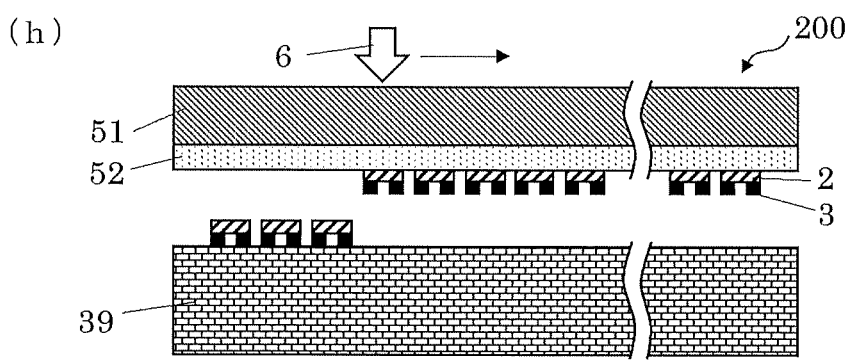
(h)
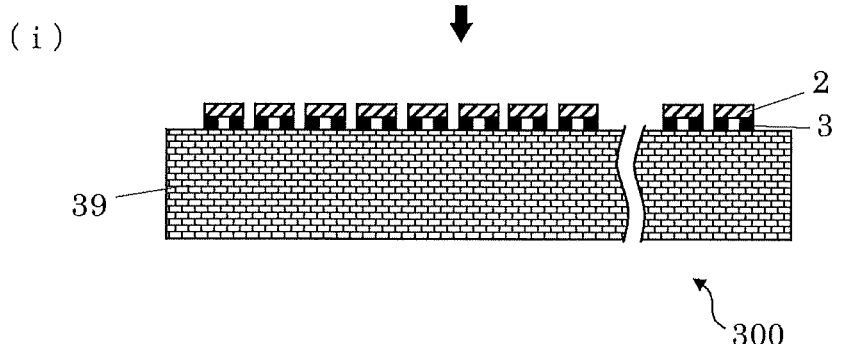
(i)

[FIG. 4]
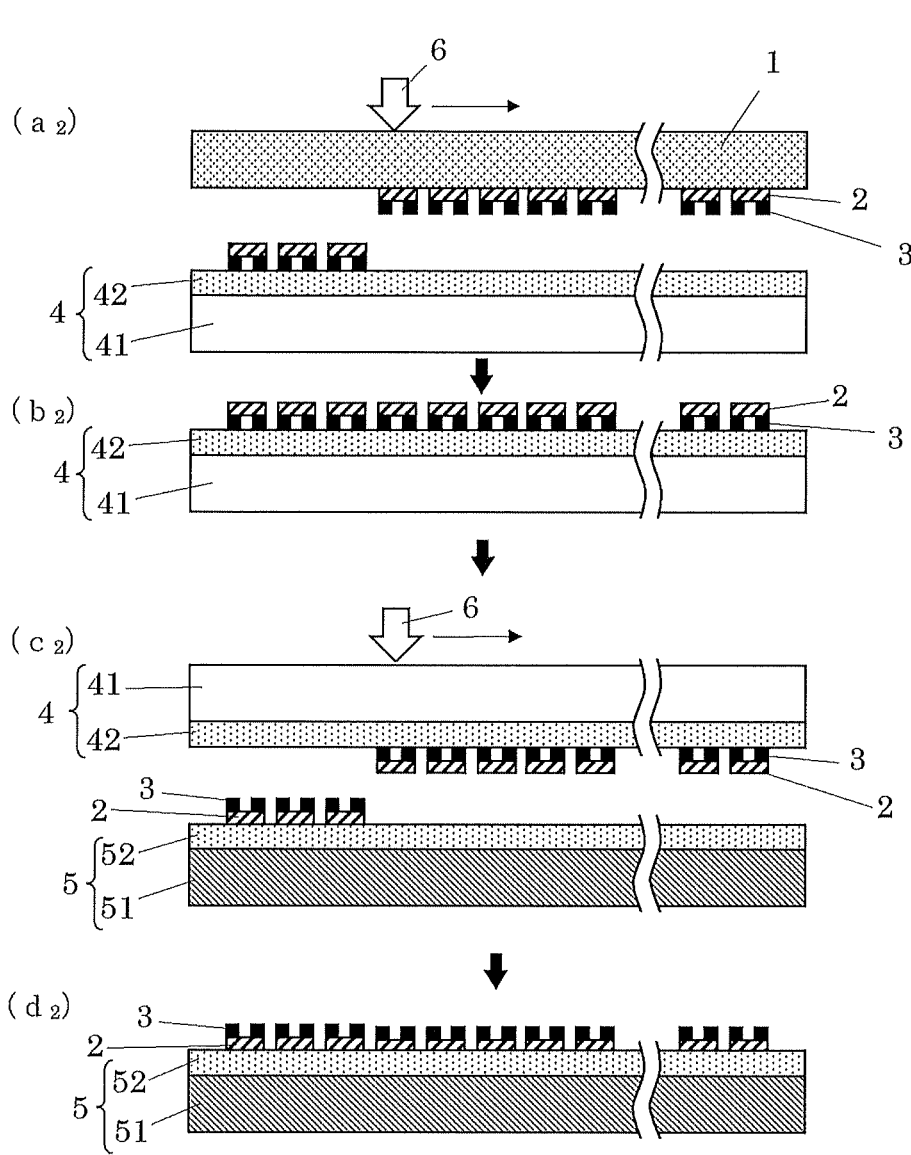

[FIG. 5]
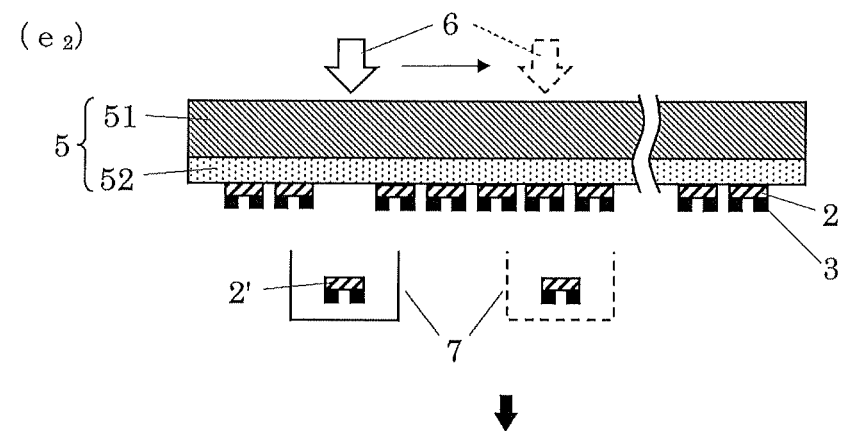
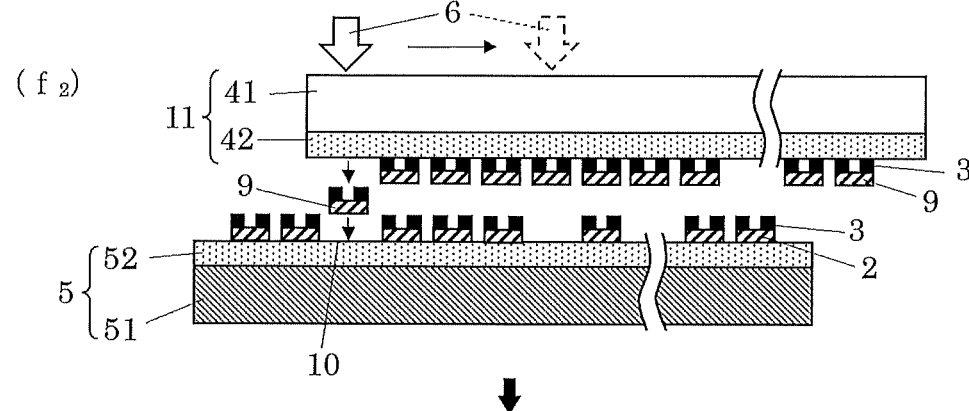
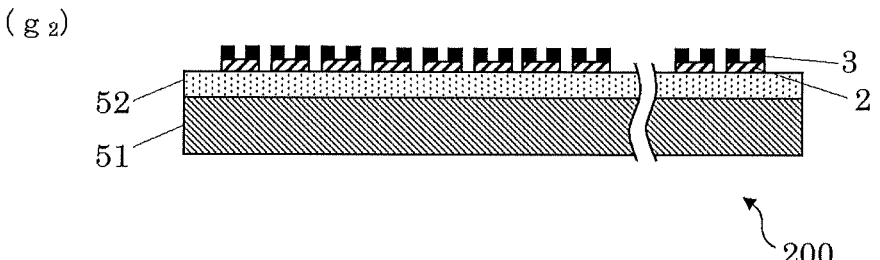

[FIG. 6]
(f')
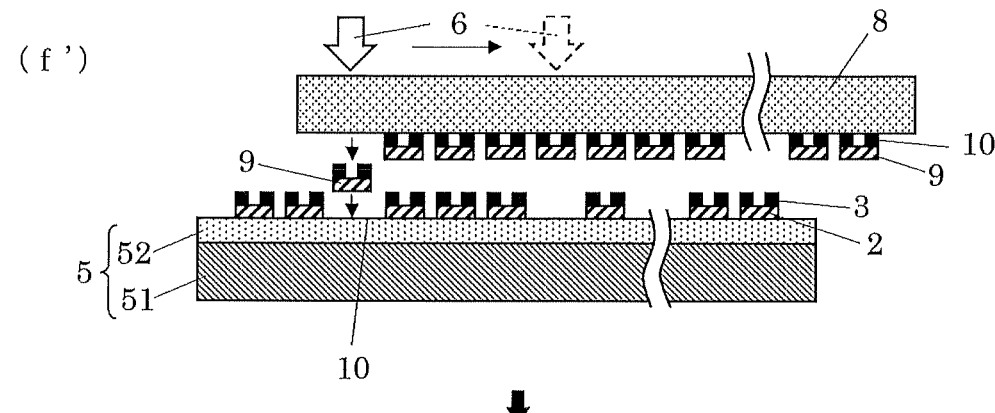
(g')
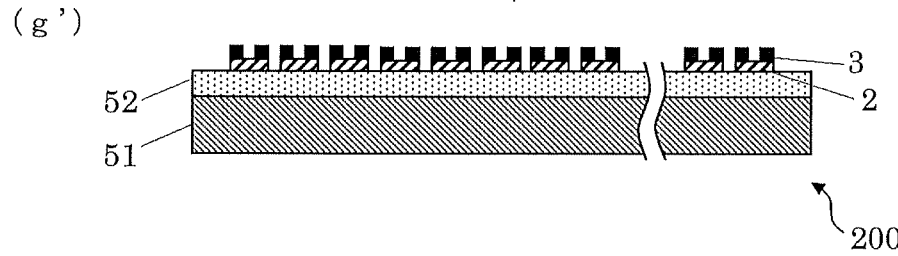
[FIG. 7]
(a₄)
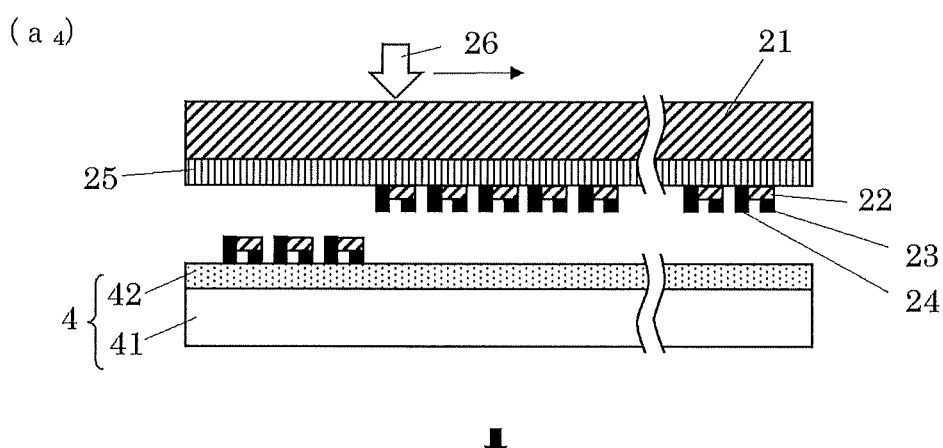
(b₄)
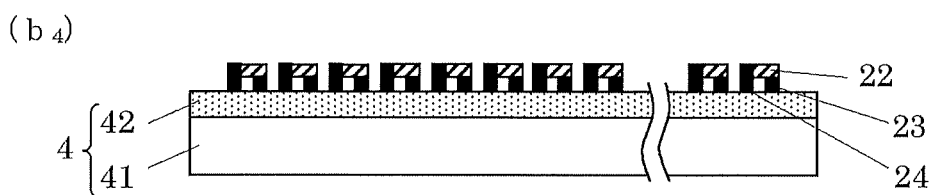

[FIG. 8]
(a 5-1)
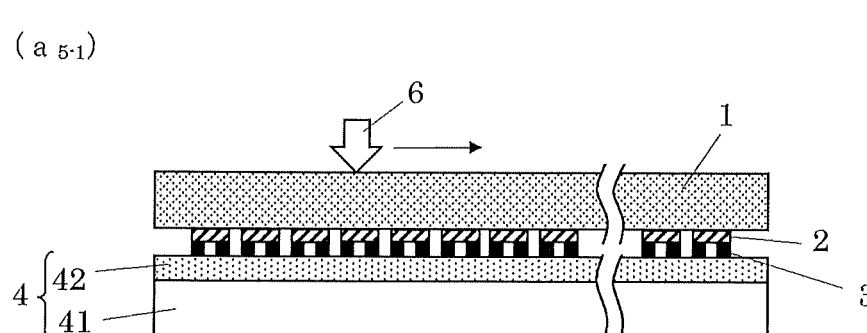
(a 5-2)
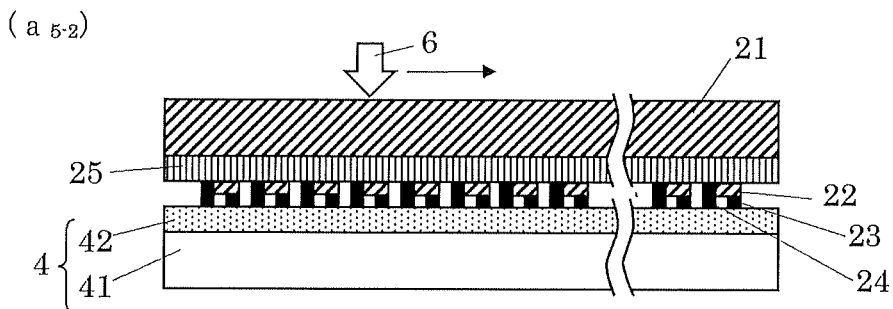
(f 5)
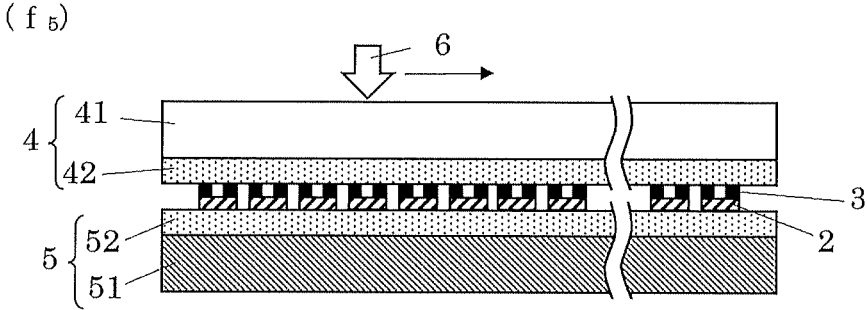

[FIG. 9]
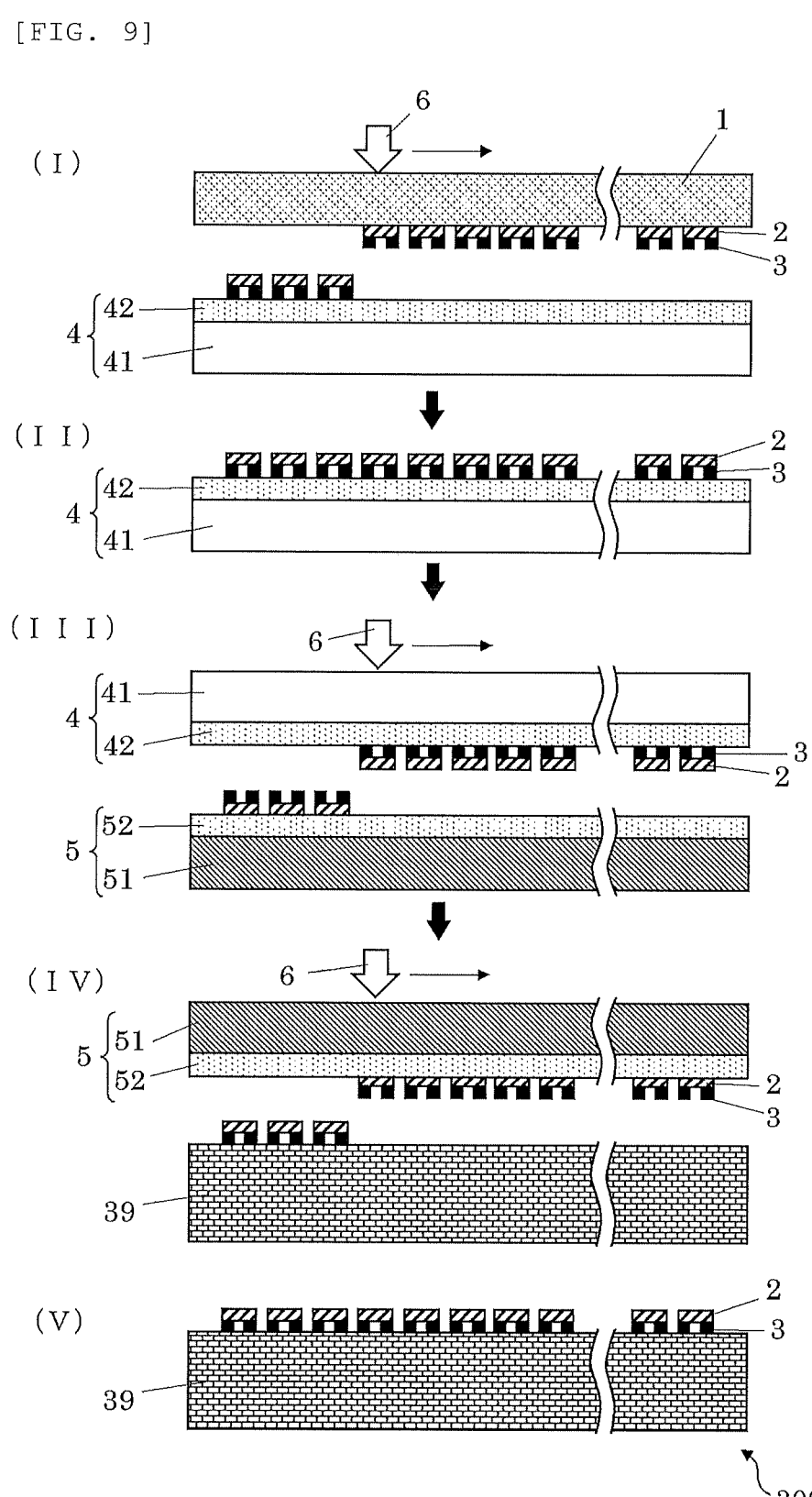

METHOD FOR PRODUCING A LIGHT EMITTING DIODE SUPPLY SUBSTRATE, METHOD FOR PRODUCING A LIGHT EMITTING DIODE DISPLAY, METHOD FOR PRODUCING A DIVISION UNIT FOR A LIGHT EMITTING DIODE DISPLAY, AND METHOD FOR PRODUCING A DEVICE SUPPLY SUBSTRATE

TECHNICAL FIELD

The present invention relates to a method for producing a light emitting diode supply substrate, a method for producing a light emitting diode display, a method for producing a division unit for a light emitting diode display, and a method for producing a device supply substrate.

BACKGROUND ART

In recent years, displays using mini light emitting diodes and micro light emitting diodes have been actively developed. One of major production issues for their practical use relates to production means for arranging minute light emitting diodes on the display panel. Microstructure transfer technology using stamp is attracting attention as an assembly means (for example, Patent Document 1 and Non-Patent Document 1).

When assembling an FHD (1920×1080) display panel using this technology, if the light emitting diodes are transferred one by one from the light emitting diode supply substrate, 2,073,600 pixels worth of transfer are required. When producing a color display, it is necessary to transfer at least three kinds of mini light emitting diodes or micro light emitting diodes of red (R), green (G) and blue (B) per pixel. If it were to be transferred one device at a time, it would be necessary to transfer about 6,000,000 times or more. In the case of a 4K display, more than 24 million transfer operations are required. Even if the display is assembled with such efforts, there is a problem that if a supply substrate containing a large number of defective light emitting diodes is used, the normal light emitting diodes must be rearranged, that is, repaired, on the display panel substrate. Therefore, there is a strong demand for a supply substrate on which only normal light emitting diodes are mounted. This problem is an essential common problem even in the case of collective transfer from the supply substrate to the display panel substrate.

A laser lift-off method is available as a faster and more efficient transfer means that replaces the stamp method. Patent Document 2 discloses a method in which a separation layer is provided between a micro functional devices to be transferred and a substrate, and the separation layer is ablated during laser irradiation to separate the substrate and the devices. The disadvantage of using this method is that the material of the separation layer adheres to the micro functional device side, so that it is necessary to clean the devices after the transfer. Therefore, it is not always that this method is good. As a method that does not use a separation layer, there is a method that utilizes the pressure-sensitive adhesive properties of PDMS (PolyDiMethylSiloxane), which is a silicone resin (Patent Document 3, Non-Patent Document 2). When this method is used, extra deposits do not adhere to the micro functional devices after the micro functional devices are subjected to the laser lift-off. Therefore, expectations are increasing for the laser lift-off method using silicone resin. An example of an apparatus for transferring micro functional devices by the laser lift-off method is disclosed in Patent Document 4.

An example of a conventional method for producing a light emitting diode display panel by the above-described laser lift-off method will be described below with reference to FIG. 9. FIGS. 9(I) to (III) show an example of a step for producing a supply substrate from a light emitting diode producing substrate, a step for transferring light emitting diodes one by one to a display panel substrate in above-mentioned stamp method is shown in FIGS. 9(IV) and (V).

In FIG. 9(I), "1" is a sapphire substrate as a starting substrate, and a plurality of GaN-based light emitting diodes 2 formed on one surface thereof are processed to be separated from each other. Furthermore, the light emitting diode 2 has an electrode 3. "4" is a first supply substrate and is composed of a substrate 41 made of quartz and a silicone resin layer 42 as an adhesive layer formed thereon.

As shown in FIG. 9(I), the first supply substrate 4 and the starting substrate (sapphire substrate) 1 are arranged so that the light emitting diodes 2 face the adhesive layer 42 and the gap between the two is set constant and optimal. In this state, the starting substrate 1 is irradiated with a laser beam 6 from the surface side where the light emitting diodes 2 are not formed. The laser light 6 passes through the starting substrate 1 and reaches the vicinity of the interface between the surface of the starting substrate 1 and the light emitting diodes 2, so that the GaN on the side of the light emitting diodes 2 in the vicinity of this interface is thinly subjected to the laser ablation. This is the so-called laser lift-off, in which the light-emitting diodes 2 are separated from the starting substrate 1 and emitted towards the first supply substrate 4 facing the light emitting diodes 2. As a result, the emitted light emitting diodes 2 fly to the surface of the adhesive layer (silicone resin layer) 42 and are temporarily adhered to the surface of the adhesive layer 42. By scanning the desired area of the starting substrate 1 with the laser beam 6, all the desired light emitting diodes 2 on the starting substrate 1 can be transferred to the first supply substrate 4, and the first supply substrate 4 shown in FIG. 9(II) is completed. In this case, since the GaN component does not adhere to the light emitting diodes 2 as a residue due to the ablation, there is no need to clean away deposits including a part of the separation layer, unlike the case of the separation layer (including the organic polymer).

Next, as shown in FIG. 9(III), a second supply substrate 5 having a substrate 51 and a silicone resin layer 52 as an adhesive layer thereon is prepared. Next, the second supply substrate 5 and the first supply substrate 4 of FIG. 9(II) are arranged so that the light emitting diode 2 faces the adhesive layer 52 and the gap between the two is set constant and the optimum distance is maintained.

In this state, a desired region of the surface of the first supply substrate 4 on which the light emitting diodes 2 are not arranged is irradiated with the laser light 6 while scanning, so that the light emitting diodes 2 provided with the electrodes 3 are turned upside down. The second supply substrate 5 temporarily bonded in this state is completed. In this manner, the second supply substrate 5 as a light emitting diode supply substrate having the electrodes 3 arranged facing outward can be produced.

Next, a display panel substrate 39 as a supply destination shown in FIG. 9(IV) is prepared. The display panel substrate 39 has electrodes and wirings (not shown). The display panel substrate 39 and the second supply substrate 5 are arranged with a constant gap therebetween and an optimum distance therebetween. In this state, the laser light 6 is irradiated to the surface of the second supply substrate 5 where the light emitting diodes 2 are not arranged. By such a laser lift-off method, a plurality of light emitting diodes 2 are transferred from the second supply substrate 5 to the display panel substrate 39, as shown in FIG. 9(V).

Using the laser lift-off method in this way, the display panel 300 is completed by arranging the electrodes 3 of the light emitting diodes 2 to be in electrical contact with desired electrode positions on the display panel substrate 39 (FIG. 9(V)).

However, even if a display is produced using the laser lift-off method, which can be transferred at a higher speed than the stamp method, when a supply substrate containing a large number of defective light emitting diodes is used, there is a problem that normal light emitting diodes on the display substrate have to be rearranged, that is, repaired. Therefore, there is a strong demand for a supply substrate on which only normal light emitting diodes are mounted.

CITATION LIST

Patent Literature

Patent Document 1: U.S. Pat. No. 7,943,491 B1
Patent Document 2: JP 5319533 B
Patent Document 3: U.S. Pat. No. 9,555,644 B1
Patent Document 4: JP 2020-4478 A Non Patent Literature Non Patent Document 1: Matthew A. Meitl, Zheng-Tao Zhu, Vipan Kumar, Keon Jae Lee, Xue Feng, Yonggang Y. Huang, Ilesanmi Adesida, Ralph G. Nuzzo & John A. Rogers, "Transfer printing by kinetic control of adhesion to an elastomeric stamp", Nature Materials, Volume 5, 33-38 (2006)

Non Patent Document 2: Kristin M. Charipar, Raymond C. Y. Auyeung, Heungsoo Kim, Nicholas A. Charipar and Alberto Pique, "Use of an Elastomeric Donor for LIFT of Metal Foils", JLMN-Journal of Laser Micro/Nanoengineering, Vol. 13, No. 2, 2018.

SUMMARY OF INVENTION

Technical Problem

As described above, regardless of whether the stamp method or the laser lift-off method is used, when the light emitting diodes mounted on the supply substrate (the second supply substrate 5 in FIG. 9) that supplies the light emitting diodes to the display panel substrate include defective light emitting diodes, the defective light emitting diodes are transferred to the display panel substrate as they are, and there has been a problem that the yield of normal transfer decreases.

The present invention has been made to solve the above problems, and an object of the present invention is to provide a method for producing a light emitting diode supply substrate capable of producing a light emitting diode supply substrate capable of transferring a plurality of normal light emitting diodes to a supply destination, and a method for producing a light emitting diode display with high yield, a method for producing a division unit for a light emitting diode display with high yield, and a method for producing a device supply substrate capable of producing a device supply substrate capable of transferring a plurality of normal devices to a supply destination.

Solution to Problem

In order to solve the above problems, the present invention provides a method for producing a light emitting diode supply substrate for transferring a plurality of light emitting diodes to a supply destination, comprising:

a first mounting step of mounting a plurality of light emitting diodes on a supply substrate;

a selective removal step of selectively removing defective light emitting diodes on the supply substrate; and a second mounting step of transferring a normal light emitting diode to a position where the defective light emitting diode has been arranged on the supply substrate.

According to this, it is possible to produce a light emitting diode supply substrate having only normal light emitting diodes. By using the light emitting diode supply substrate thus produced, a plurality of normal light emitting diodes can be transferred to a supply destination collectively or selectively. That is, according to the method for producing a light emitting diode supply substrate of the present invention, it is possible to produce a light emitting diode supply substrate that can transfer a plurality of normal light emitting diodes to a supply destination collectively or selectively.

In addition, since the light emitting diode supply substrate produced by the method for producing the light emitting diode supply substrate of the present invention does not contain defective light emitting diodes, it can be significantly reduced generation of light emitting defect when producing the light emitting diode display or the division unit of the light emitting diode display. As a result, it is possible to produce the light emitting diode display or its division unit with high yield and high efficiency.

It is preferable to further include a determination step of determining whether each of the light emitting diodes on the supply substrate is normal or not before the selective removal step.

In this way, defective light emitting diodes can be reliably sorted out.

Moreover, it is preferable that the determination step is performed by a photoluminescence method.

If the determination step is performed by a photoluminescence method, determination can be made without contact.

Preferably, the selective removal step, the second mounting step, or both are performed by a laser lift-off method.

If the selective removal step, the second mounting step, or both are performed by the laser lift-off method, the light emitting diode supply substrate can be manufactured with higher efficiency.

An excimer laser is preferably used for the laser lift-off method in the selective removal step, the second mounting step, or both.

In this way, time-compressed pulsed laser light can be generated. The pulse width and light intensity can be easily controlled by controlling the device power parameters such as the pulse transmission voltage, and a single pulse of high intensity laser light that cannot be realized with other continuous wave (CW) lasers can be generated.

A pulse laser may be used as the laser for the laser lift-off method in the selective removal step, the second mounting step, or both, and the lift-off may be performed by irradiating one pulse of laser light.

In this way, the laser used in the selective removal step, the second mounting step, or both of them need not be limited to an excimer laser, and a laser capable of generating a required intensity of pulsed laser light can be used.

As the light emitting diode, it is preferable to use one having a maximum length of less than 300 μm.

In this way, transfer can be performed more efficiently by the laser lift-off method.

As the light emitting diode, one type selected from the group consisting of a red light emitting diode, a green light emitting diode and a blue light emitting diode can be used.

In this way, monochromatic supply substrates for red, green and blue light emitting diodes can be produced.

The plurality of light emitting diodes can also be arranged such that one or more a red light emitting diodes, one or more green light emitting diodes, and one or more blue light emitting diodes constitutes a set of pixels.

In this way, when producing a light emitting diode display, it is possible to transfer in batches or in units of one pixel.

It is preferable that a supply substrate that includes a quartz substrate and an adhesive layer provided on the quartz substrate, and in the first mounting step, a plurality of light emitting diodes are adhered in a matrix on the surface of the adhesive layer of the supply substrate.

In this way, the supply substrate for light emitting diodes can be produced efficiently.

It is preferable that, in the second mounting step, a supplement substrate is prepared, the supplement substrate including a quartz substrate, an adhesive layer provided on the quartz substrate, and a plurality of light emitting diodes adhered to the surface of the adhesive layer in a matrix; and the normal light emitting diodes on the supplement substrate are transferred to a position on the supply substrate from which the defective light emitting diodes were removed.

In this way, the supply substrate for light emitting diodes can be produced more efficiently.

It is preferable that an arrangement step of arranging the supplement substrate to face the supply substrate is further included between the selective removal step and the second mounting step.

By doing so, the accuracy in the second mounting step can be further improved.

In this case, alignment is performed so that the positions where the defective light emitting diodes have been arranged on the supply substrate and positions of the normal light emitting diodes on the supplement substrate face each other in the arranging step.

As a result, normal light emitting diodes can be more accurately mounted at positions where defective light emitting diodes have been removed.

It is preferable that the quartz substrate made of synthetic quartz is used as the supply substrate.

Synthetic quartz can exhibit excellent in-plane film thickness uniformity. Therefore, if synthetic quartz is used for the quartz substrate, it is possible to control the gap between the substrates facing each other in order to perform the laser lift-off method.

The quartz substrate of the supplement substrate is also preferably made of synthetic quartz. In this case, for example, when the supplement substrate is arranged so as to face the supply substrate in parallel in the arrangement step, it can be arranged at a constant distance over the entire surface of the substrate with high accuracy.

It is preferable to use a quartz substrate provided with facets as the supply substrate.

By doing so, when the supply substrate is set in the transfer apparatus using the laser lift-off method, rotation position can be set without making a mistake.

In this case, it is more preferable to use the quartz substrate provided with facets as the supplement substrate.

In this case, it is further preferred that the facets are orientation markings.

In this case, when the supply substrate is set in the transfer apparatus using the laser lift-off method, rotation position can be set without making a mistake.

The quartz substrate having one or more selected from the group consisting of characters, symbols and 2D barcodes can be used as the supply substrate.

As the supplement substrate, the quartz substrate having one or more selected from the group consisting of characters, symbols and 2D barcodes can also be used.

By doing so, it is possible to manage individual supply substrates and supplement substrates.

The characters, symbols and 2D barcodes may be orientation markings.

Individual identification of the supply substrate can be performed by the characters, the symbols and the 2D bar code. It can also be a mark indicating orientation.

In this case, when the supply substrate is set in the transfer apparatus using the laser lift-off method, individual identification can be performed accurately, and the rotation position can be set without making a mistake.

It is preferable to use one in which the adhesive layer is made of a pressure-sensitive adhesive containing silicone as the supply substrate.

As the supplement substrate, the one in which the adhesive layer is made of a pressure-sensitive adhesive containing silicone can also be used.

This can provide good adhesion. Further, impurities do not adhere to the light emitting diodes when the light emitting diodes are transferred by the laser lift-off method. Furthermore, after removing the light emitting diodes once, the light emitting diodes can be adhered again.

It is preferable that the supply substrate having a pitch of the matrix being a pixel pitch of a display panel or an 1/integral number of the pixel pitch is used as the supply substrate.

In this way, a plurality of light emitting diodes can be transferred by the laser lift-off method in which the laser irradiation position is controlled and moved by performing only the minimum movement operation without unnecessary alignment movement of the supply substrate.

It is preferable that the first mounting step includes:

a step of preparing a starting substrate on which the plurality of light emitting diodes are produced;

a step of separating the plurality of light emitting diodes on the starting substrate one by one; and a step of transferring the plurality of light emitting diodes separated one by one onto the supply substrate.

By doing so, the first mounting step can be performed efficiently.

It is preferable that the step of transferring the plurality of light emitting diodes onto the supply substrate in the first mounting step is performed by a laser lift-off method.

By doing so, the first mounting step can be performed more efficiently.

The present invention also provides a method for producing a light emitting diode display, comprising:

a step of producing the light emitting diode supply substrate by the method for producing the light emitting diode supply substrate according to the present invention; and a step of transferring the plurality of light emitting diodes on the light emitting diode supply substrate onto a display panel substrate.

In the method for producing a light emitting diode display of the present invention, the light emitting diode supply substrate is produced by the method for producing a light emitting diode supply substrate of the present invention, and a plurality of light emitting diodes are transferred to the light emitting diode display substrate using this substrate. Thus, a light emitting diode display that does not containing defective light emitting diodes can be efficiently produced. That is, according to the producing method of the light emitting diode display of the present invention, the light emitting diode display can be produced with a high yield.

It is preferable that the step of transferring the plurality of light emitting diodes on the light emitting diode supply substrate onto the display panel substrate is performed by a laser lift-off method.

In this way, a plurality of light emitting diodes can be transferred at a higher speed, so that a more practical method for producing a light emitting diode display can be provided.

The present invention also provides a method for producing a division unit for a light emitting diode display, comprising:

a step of producing a light emitting diode supply substrate by the method for producing the light emitting diode supply substrate according to the present invention; and a step of transferring the plurality of light emitting diodes on the light emitting diode supply substrate onto a division unit of the light emitting diode display.

In the method for producing a division unit of a light emitting diode display of the present invention, a light emitting diode supply substrate is producing by the method for producing a light emitting diode supply substrate of the present invention, and a plurality of light emitting diodes are transferred to the division unit of a light emitting diode display using the same. Therefore, it is possible to efficiently produce a division unit of a light emitting diode display that does not contain defective light emitting diodes. That is, according to the method for producing the division unit of the light emitting diode display of the present invention, the division unit of the light emitting diode display can be produced with a high yield.

It is preferable that the step of transferring the plurality of light emitting diodes on the light emitting diode supply substrate onto the division unit of the light emitting diode display is performed by a laser lift-off method.

In this way, a plurality of light emitting diodes can be transferred at a higher speed, so that a more practical method for producing a division unit of a light emitting diode display can be provided.

Further, in the present invention, there is provided a method for producing a device supply substrate for transferring a plurality of devices to a supply destination, comprising:

a first mounting step for mounting a plurality of devices on a supply substrate;

a selective removal step of selectively removing a defective device on the supply substrate; and a second mounting step of transferring a normal device to a position where the defective device was arranged on the supply substrate.

The present invention is not limited to a supply substrate for transferring light emitting diodes, but can provide a device supply substrate for transferring devices such as minute electrical devices and minute semiconductor chips. This device supply substrate can transfer a plurality of normal devices to a supply destination. Such a method for producing a device supply substrate can be used, for example, for three-dimensional mounting and producing of electrical/electronic equipments.

For example, the device can be an electrical device, a semiconductor chip, or a MEMS device.

Thus, the method for producing a device supply substrate of the present invention can be applied to supply various devices.

Advantageous Effects of Invention

As described above, according to the method for producing a light emitting diode supply substrate of the present invention, it is possible to produce a light emitting diode supply substrate that can transfer a plurality of normal light emitting diodes to a supply destination collectively or selectively.

In addition, since the light emitting diode supply substrate produced by the method for producing the light emitting diode supply substrate of the present invention does not contain defective light emitting diodes, it can be significantly reduced generation of light emitting defect when producing the light emitting diode display or the division unit of the light emitting diode display. As a result, it is possible to produce the light emitting diode display or its division unit with high yield and high efficiency.

Furthermore, the method for producing a light emitting diode display and the method for producing a division unit of a light emitting diode display of the present invention include the method for producing a light emitting diode supply substrate of the present invention, so that the light emitting diode display or division unit of the light emitting diode display which does not contain defective light emitting diodes can be produced efficiently.

According to the method for producing a device supply substrate of the present invention, it is possible to produce a device supply substrate that can transfer a plurality of normal devices to a supply destination collectively or selectively.

BRIEF DESCRIPTION OF DRAWINGS

FIG. 1 is an explanatory diagram showing a part of a first embodiment of a method for producing a light emitting diode supply substrate of the present invention.

FIG. 2 is an explanatory diagram showing another part of the first embodiment of the method for producing a light emitting diode supply substrate of the present invention.

FIG. 3 is an explanatory view showing a part of an example of a method for producing a light emitting diode display using the light emitting diode supply substrate produced by the producing method shown in FIGS. 1 and 2.

FIG. 4 is an explanatory view showing a part of the second embodiment of the method for producing the light emitting diode supply substrate of the present invention.

FIG. 5 is an explanatory view showing another part of the second embodiment of the method for producing a light emitting diode supply substrate of the present invention.

FIG. 6 is an explanatory view showing a part of the third embodiment of the method for producing the light emitting diode supply substrate of the present invention.

FIG. 7 is an explanatory view showing a part of the fourth embodiment of the method for producing the light emitting diode supply substrate of the present invention.

FIG. 8 is an explanatory diagram showing a part of the fifth embodiment of the method for producing a light emitting diode supply substrate of the present invention.

FIG. 9 is an explanatory view showing an example of a conventional method for producing a light emitting diode supply substrate and an example of a method for producing a light emitting diode display.

DESCRIPTION OF EMBODIMENTS

As described above, there was a demand for the development of a method for producing a light emitting diode supply substrate capable of producing a light emitting diode supply substrate capable of collectively or selectively transferring a plurality of normal light emitting diodes to a supply destination, a method for producing a light emitting diode display with high yield, a method for producing a division unit of a light emitting diode display with high yield, and a method for producing a device supply substrate capable of producing a device supply substrate capable of collectively or selectively transferring a plurality of normal devices to a supply destination.

As a result of intensive studies on the above problems, the inventors of the present invention have found that a method for producing a light emitting diode supply substrate including a selective removal step of selectively removing defective light emitting diodes and a second mounting step of transferring normal light emitting diodes to positions where defective light emitting diodes are arranged, can solve the above problems, and completed the present invention.

That is, the present invention is a method for producing a light emitting diode supply substrate for transferring a plurality of light emitting diodes to a supply destination, comprising:

a first mounting step of mounting a plurality of light emitting diodes on a supply substrate;

a selective removal step of selectively removing defective light emitting diodes on the supply substrate; and a second mounting step of transferring a normal light emitting diode to a position where the defective light emitting diode has been arranged on the supply substrate.

The present invention also provides a method for producing a light emitting diode display, comprising:

a step of producing the light emitting diode supply substrate by the method for producing the light emitting diode supply substrate; and a step of transferring the plurality of light emitting diodes on the light emitting diode supply substrate onto a display panel substrate.

Further, the present invention provides a method for producing a division unit for a light emitting diode display, comprising:

a step of producing a light emitting diode supply substrate by the method for producing the light emitting diode supply substrate; and a step of transferring the plurality of light emitting diodes on the light emitting diode supply substrate onto a division unit of the light emitting diode display.

The present invention also provides a method for producing a device supply substrate for transferring a plurality of devices to a supply destination, comprising:

a first mounting step for mounting a plurality of devices on a supply substrate;

a selective removal step of selectively removing a defective device on the supply substrate; and a second mounting step of transferring a normal device to a position where the defective device was arranged on the supply substrate.

Hereinafter, the present invention will be described in detail below, but the present invention is not limited thereto.

[Method for Producing Light Emitting Diode Supply Substrate]

The present invention is a method for producing a light emitting diode supply substrate for transferring a plurality of light emitting diodes to a supply destination, comprising:

a first mounting step of mounting a plurality of light emitting diodes on a supply substrate;

a selective removal step of selectively removing defective light emitting diodes on the supply substrate; and a second mounting step of transferring a normal light emitting diode to a position where the defective light emitting diode has been arranged on the supply substrate.

In the method for producing a light emitting diode supply substrate of the present invention, in the selective removal step, defective light emitting diodes are selected from among the plurality of light emitting diodes arranged on the supply substrate in the first mounting step and removed. Then, in the second mounting step, normal light emitting diodes are transferred to the positions where the previously removed defective light emitting diodes have been arranged. According to such a producing method, it is possible to produce a light emitting diode supply substrate having only normal light emitting diodes. By using the light emitting diode supply substrate thus produced, a plurality of normal light emitting diodes can be collectively or selectively transferred to the supply destination by the laser lift-off method or the stamp method. That is, according to the method for producing a light emitting diode supply substrate of the present invention, it is possible to produce a light emitting diode supply substrate capable of collectively transferring a plurality of normal light emitting diodes to a supply destination. In addition, a normal light emitting diode can be transferred to a supply destination by selecting a light emitting diode at a desired position on the light emitting diode supply substrate produced according to the present invention and using the laser lift-off method. In other words, it is possible to produce a light emitting diode supply substrate on which normal light emitting diodes can be transferred regardless of which position is selected.

Furthermore, since the light emitting diode supply substrate produced by the method for producing the light emitting diode supply substrate of the present invention does not contain defective light emitting diodes, it can be significantly reduced generation of light emitting defect when producing the light emitting diode display or the division unit of the light emitting diode display. As a result, it is possible to produce the light emitting diode display or its division unit with high yield and high efficiency.

Next, each step will be described in more detail.

[First Mounting Step]

In the first mounting step, a plurality of light emitting diodes are mounted on the supply substrate.

As the supply substrate here, for example, a substrate including a quartz substrate and an adhesive layer provided on the quartz substrate can be used. Details of the supply substrate, the quartz substrate, and the adhesive layer will be described later.

As the light emitting diode, one type selected from the group consisting of a red light emitting diode, a green light emitting diode and a blue light emitting diode can be used.

In this way, single-color supply substrates for red, green, and blue light-emitting diodes can be produced.

As the light emitting diode, it is preferable to use a light emitting diode whose longest part is smaller than 300 μm.

By doing so, the inertial mass of the light emitting diode is reduced, and more efficient transfer by the laser lift-off method becomes possible.

Although the lower limit of the longest part of the light emitting diode is not particularly limited, for example, a light emitting diode with a longest part of 10 μm or more can be used.

In the first mounting step, it is preferable to adhere a plurality of light emitting diodes in a matrix on the surface of the adhesive layer of the supply substrate.

In this way, the supply substrate for light emitting diodes can be produced efficiently.

In this case, it is preferable to use a matrix whose pitch is the pixel pitch of the display panel or an 1/integral number of the pixel pitch.

In this way, a plurality of light emitting diodes can be collectively transferred by the laser lift-off method in which the laser irradiation position is controlled and moved by performing only the minimum movement operation without unnecessary alignment movement of the supply substrate.

The first mounting step is preferably include:
a step of preparing a starting substrate on which the plurality of light emitting diodes are produced;
a step of separating the plurality of light emitting diodes on the starting substrate one by one; and
a step of transferring the plurality of light emitting diodes separated one by one onto the supply substrate.

By doing so, the first mounting step can be performed efficiently.

Here, as the starting substrate, for example, one including a sapphire substrate and a plurality of light emitting diodes produced on this sapphire substrate can be used.

It is preferable that the step of transferring the plurality of light emitting diodes in the first mounting step is performed by a laser lift-off method.

By doing so, the first mounting process can be performed more efficiently.

[Selective Removal Step]

In the selective removal step, defective light emitting diodes on the supply substrate are selectively removed.

It is preferable to further include a determination step of determining whether the individual light emitting diodes on the supply substrate are normal or not before the selective removal step.

By doing so, the defective light emitting diode can be more reliably removed in the selective removal step.

In this determination step, information on the position of the defective light emitting diode may be recorded by mapping, for example.

Moreover, it is preferable to perform a determination step by the photoluminescence method.

If the determination step is performed by the photoluminescence method, it can be determined without contact.

The photoluminescence method is a method of irradiating a substance with light and observing the light generated when the excited electrons return to the ground state, and normal/defective of material and functional device such as electronic devices can be determined from detected photo information. For light emitting diodes, for example, there is the INSPECTRA PL series from TASMIT, Inc.

The photoluminescence method is preferable because it is non-contact and has a high determination speed. However, other method can be used if there is a method more suitable than photoluminescence method for substance to be determined normal/defective. When a substance other than a light emitting diode or an electronic device such as a functional device is targeted, a method suitable for each determination target may be used.

The selective removal step is preferably performed by a laser lift-off method.

When the laser lift-off method is used for the selective removal step, only the defective light emitting diodes on the target can be easily removed, and as a result, the light emitting diode supply substrate can be produced with higher efficiency.

When the selective removal step is performed by the laser lift-off method, it is preferable to shape the laser beam to approximately the same size as the defective light emitting diode in the vicinity of the interface between the defective light emitting diode and the adhesive layer of the supply substrate.

In this way, each defective light emitting diode can be selectively removed by laser lift-off.

In addition, by scanning the laser light and irradiating different light emitting diode positions at each irradiation timing, it is possible to selectively subject defective light emitting diodes as targets to laser lift-off.

A laser light that can be used in the laser lift-off method in the selective removal step will be described later.

[Second Mounting Step]

In the second mounting step, a normal light emitting diodes are transferred to the position where the defective light emitting diodes have been arranged on the supply substrate.

The second mounting step is preferably performed by:
preparing a supplement substrate that includes a quartz substrate, an adhesive layer provided on the quartz substrate, and a plurality of light emitting diodes adhered to the surface of the adhesive layer in a matrix; and
transferring the normal light emitting diodes on the supplement substrate to the position on the supply substrate from which the defective light emitting diodes have been removed.

By doing so, the supply substrate for the light emitting diodes can be produced more efficiently.

Alternatively, the supplement substrate may include, for example, a sapphire substrate and a plurality of light emitting diodes fabricated on the sapphire substrate, similar to the starting substrate.

It is preferable that an arrangement step of arranging the supplement substrate to face the supply substrate is further included between the selective removal step and the second mounting step.

By doing so, the accuracy in the second mounting step can be further improved.

In this case, in the arrangement step, it is preferable that the position where the defective light emitting diodes have been arranged on the supply substrate and the position of the normal light emitting diode on the supplement substrate are aligned so as to face each other.

As a result, normal light emitting diodes can be more accurately mounted at positions where defective light emitting diodes have been removed.

The second mounting step is preferably performed by a laser lift-off method.

If the second mounting step is performed by the laser lift-off method, only the normal light emitting diodes that are the target can be selected and easily transferred to the positions where the defective light emitting diodes have been arranged, resulting in higher efficiency in producing a light emitting diode supply substrate.

When the second mounting step is performed by the laser lift-off method, the laser light is preferably shaped to approximately the same size as the normal light emitting diode to be transferred in the vicinity of the interface between the normal light emitting diode to be transferred and the adhesive layer of the supplement substrate.

In this way, the normal light emitting diodes can be selectively subjected to the laser lift-off one by one, and the normal light emitting diodes can be more accurately transferred to the positions where the defective light emitting diodes have been arranged.

In addition, by scanning the laser light and irradiating different light emitting diode positions at each irradiation timing with the laser light, it is possible to selectively subject the target normal light emitting diodes to the laser lift-off.

A laser light that can be used in the laser lift-off method in the second mounting step will be described later.

In the method for producing the light emitting diode supply substrate according to the present invention, the substrate obtained in the second mounting step may be used as the light emitting diode supply substrate as it is. Alternatively, a plurality of light emitting diodes may be transferred from one or more substrates obtained in the second mounting step to another substrate, and the resulting substrate may be used as a light emitting diode supply substrate. Specific examples of each will be described later.

Next, the supply substrate, optional supplement substrate, laser light, and light emitting diodes that can be used in the method for producing the light emitting diode supply substrate according to the present invention will be described in more detail.

[Supply Substrate]

The planar shape of the supply substrate may be circular or rectangular. Of course, an optimum shape may be used depending on the purpose. When simply using it as a supply substrate for a normal light emitting diode, it can be said that the most efficient way to provide the supply substrate for the light emitting diode is to inherit the pattern layout of the producing process of the light emitting diode and to use a circular supply substrate. On the other hand, if the focus is on the light emitting diode supply substrate for producing the final display, the shape of the supply substrate corresponding to a divisional unit of the desired display screen, so-called tile, is preferable. The divisional unit has a fraction of the desired display screen divided in the horizontal and vertical into an integer number while maintaining the desired display screen (shape, aspect ratio). Thus, it is preferable to provide a supply substrate in a shape suitable for the final product, such as an electronic device.

The quartz substrate and adhesive layer that can be used in the supply substrate and optional supplement substrate will now be described in more detail.

[Quartz Substrate]

Using a substrate including a quartz substrate as the supply substrate and any supplement substrate can provide high transmission of the UV laser light having a short wavelength that causes the laser ablation. Preferably, the quartz substrate is a synthetic quartz substrate.

Since an in-plane total thickness variation (TTV) of approximately 1 μm or less can be achieved in the case of synthetic quartz glass, using the synthetic quarts glass makes it possible to control distance between substrates facing each other to perform laser lift-off method.

A further advantage of using synthetic quartz glass is that it provides thermal stability. That is, the synthetic quartz glass substrate has a coefficient of thermal expansion about ⅕ that of other quartz glass substrates, and thermal distortion during operation can be reduced. In particular, in the case of a stamp part having convex-shaped projections, it is possible to reduce displacement and distortion of the projection position due to thermal expansion and contraction, so that an accurate laser lift-off transfer operation becomes possible.

In addition, facets are preferably provided on at least one or more vertices on the front surface or the back surface of the quartz substrate, or a mark indicating the orientation of the quartz substrate is preferably provided on any of the front surface, the back surface, and the side surface of the peripheral portion of the quartz substrate. By doing so, when the supply substrate is set in the transfer apparatus using the laser lift-off method, the supply substrate can be set without making a mistake of the rotation position.

In addition, engraving characters, symbols, 2D bar codes, etc. onto the quartz substrate makes it possible to manage individual supply substrates. These characters, symbols, 2D bar codes, or the like may be used as an orientation mark. The facets may be used as orientation markers.

[Adhesive Layer]

For the adhesive layer, it is preferable to use, for example, a (silicone-based) pressure-sensitive adhesive whose main component is silicone, which does not cause abrasion at the interface. As the silicone-based pressure-sensitive adhesive, PDMS (Polydimethylsiloxane), a silicone composition in which the side chain and both ends of PDMS are modified, and a composition including a combination thereof may be used. By adjusting the composition of each material (molecular weight, modifying group, modifying substance, modifying amount, etc.) and the mixing ratio in the case of a mixture, it is possible to control physical properties such as hardness, adhesive strength, and repeated adhesiveness of the material. In addition to mixing, optimization can be performed also by crosslinking of the various modified silicone compositions or structuring the molecules in a three-dimensional manner. When a silicone-based pressure-sensitive adhesive optimized for the process of the present invention is used, unlike a case that an organic composition whose main chain is mainly composed of an organic skeleton, such as an organic material such as polyimide or acrylic pressure-sensitive adhesive, is used as the adhesive layer, the organic adhesive layer does not remain attached to the light emitting diode when the light emitting diode is separated off from the adhesive layer by laser ablation using the laser lift-off method. As a result, it becomes possible to repeatedly mount the light-emitting diodes on the same place, which has not been possible with the conventional organic composition adhesive layer.

Should be noted that the principle of adhesion of the silicone-based pressure-sensitive adhesive used as an adhesive is that a tack force is generated by the inherent adhesive force of the material and pressing (external force acting as pressure). Since the tack force is sufficiently generated with an indentation displacement of about several microns to about 5 μm, it is sufficient that the thickness is about 5 to 10 μm. Of course, there is no problem even if it is thicker than that.

[Laser Light]

Next, laser light that can be used in the laser lift-off method will be described in more detail.

If the laser lift-off method is used in the selective removal step, the second mounting step, or both, the laser is preferably an excimer laser.

In this way, time-compressed pulsed laser light can be generated. The pulse width and light intensity can be easily controlled by controlling the device power parameters such as the pulse transmission voltage, and a single pulse of high intensity laser light that cannot be realized with other continuous wave (CW) lasers can be generated.

When the laser lift-off method is used in the selective removal step, the second mounting step, or both, it is preferable to use a pulse laser as the laser and perform the lift-off by irradiating one pulse of laser light. The reason is explained below.

The energy per wavelength of a CW laser is low. Therefore, when a CW laser is used in the laser lift-off method, the light emitting diode cannot be separated off by laser ablation unless the laser is irradiated for a long time. As described above, even if the CW laser is capable of separating, the laser energy at the moment of separating is small, so it is not easy to fly the light emitting diodes from the supply substrate side to the receiving substrate side. On the other hand, in the case of a pulsed laser, a time-compressed high-energy pulsed laser beam can be taken out, so laser ablation can be instantaneously caused by one pulse. As a result, the force for causing the light emitting diodes to fly from the substrate on the supply side to the substrate on the receiving side is large and this force is instantaneously exhibited, which is suitable for transferring the light emitting diodes by the laser lift-off method.

In particular, it is preferable to use an excimer laser among pulse lasers. XeCl (308 nm), KrF (248 nm), and ArF (193 nm) are practically preferred as excimer types. For example, as an example of XeCl excimer laser, there is LAMBDA SX sold by COHERENT, Inc., which outputs a maximum pulse energy of 1000 mJ and has the system of a maximum pulse repetition frequency of 500 Hz (500 W) and 600 Hz (600 W).

Examples of KrF and ArF excimer lasers are the IndyStar series available from COHERENT, Inc. In the case of KrF, a maximum output is 12 W and the oscillation with a maximum pulse repetition frequency of 1 KHz is possible for a maximum pulse energy of 12 mJ. Furthermore, oscillation with a maximum pulse repetition frequency of 2 KHz is possible with a maximum pulse energy of 6 mJ.

In the case of ArF, a maximum output power is 8 W and the oscillation with a maximum pulse repetition frequency of 1 KHz is possible for a maximum pulse energy of 8 mJ. Furthermore, oscillation with a maximum pulse repetition frequency of 2 KHz is possible with a maximum pulse energy of 4 mJ.

If the pulse repetition frequency is 1 KHz, the pulse time interval will be 1 msec. Actually, since the time for the arrangement step is added, in the method for producing the light emitting diode supply substrate of the present invention, the stage movement time is rate-determining, but it is possible to transfer at a much higher speed than the stamp method. Further, in the selective removal step and the second mounting step of the producing method of the light emitting diode supply substrate of the present invention, since the main purpose of each step is to remove the defective light emitting diodes and to mount the normal light emitting diodes to their positions, instead of collectively transferring the light emitting diodes arranged on the entire surface of the substrate, this method is extremely useful as a method for producing a supply substrate that does not include defective light emitting diodes.

Although the energy of the excimer laser light itself is high, the time width of one pulse is 24 nsec (FWHM) for XeCl, and 7 nsec (FWHM) for KrF and ArF. There is an advantage that damage is less likely to remain in the laser irradiation area.

It should be noted that any laser other than the excimer laser may be used as long as there is a pulse laser having sufficient performance to realize the present invention.

As described above, the laser used in the selective removal step, the second mounting step, or both of them need not be limited to the excimer laser, and any laser capable of generating a required intensity of pulsed laser light can be used.

When the step of collectively transferring a plurality of light emitting diodes in the first mounting step is performed by the laser lift-off method, the laser used is not particularly limited, but a CW laser may be used.

[Light Emitting Diode]

Next, the light emitting diodes used in the method for producing the light emitting diode supply substrate of the present invention will be described in more detail.

In general, light emitting diodes with short sides of 100 μm or more to 300 μm are called mini light emitting diodes, and those with short sides of 100 μm or less or even 50 μm or less are called micro light emitting diodes. Recently, some companies prefer the commercial advantage and refer to 150 μm×150 μm light emitting diodes as micro light emitting diodes. Although it is difficult to accurately define these senses of scale, the light emitting diodes to be transferred in the present invention are called mini light emitting diodes or micro light emitting diodes.

For example, in the case of mini light emitting diodes of 100 μm×200 μm in length×width, the height has been 100 μm or less, but recently, thin-film blue mini light emitting diodes and green mini light emitting diodes measuring 150 μm in length×150 μm in width×slightly less than 10 μm in height have been started to appear. Correspondingly, some red mini light emitting diodes are slightly less than twice as tall. In the case of micro light emitting diodes with a planar size smaller than 100 μm×100 μm, the film thickness has been further reduced to 10 microns or less, including electrodes, and to about 7 microns in some cases. As for the planar size of the light emitting diode, it has already become possible to produce a light emitting diode having a length of 25 μm×a width of 25 μm×a height of 7 μm.

When transferring the above-mentioned mini light emitting diodes and micro light emitting diodes by the laser lift-off method, the distance between the light emitting diode supply substrate and the receiving substrate is preferably adjusted so that the flying distance should be approximately four times the length of one side of the plane size or less. Preferably, it is adjusted to three times or less of the length of one side of the planar size, and more preferably, it is adjusted to twice or less of the length of one side of the planar size. If the flight distance is about four times the length of one side of the plane size, by adjusting the laser light intensity, its in-plane uniformity, and the laser light irradiation size, it is possible to transfer the light emitting diode by the laser lift-off method. Note that the laser irradiation size may be a spot size approximately the same as or slightly larger than the size of the target light emitting diode.

Of course, it may be equal to or less than the length of one side of the plane size. Although it is difficult to achieve with an ordinary quartz substrate, by using a synthetic quartz substrate having an in-plane film thickness uniformity of 1 μm or less in TTV as the base material of the supply substrate, the gap between the supply substrate and the receiving substrate can be reduced to several tens of microns. The critical distance of the gap depends on the potential of the equipment handling the supply and receiving substrates.

A plurality of light emitting diodes may be arranged on the light emitting diode supply substrate such that one or more red light emitting diodes, one or more green light emitting diodes and one or more blue light emitting diodes constitutes a set of pixels.

For example, in the second mounting step, a supply substrate for red light emitting diodes, a supply substrate for green light emitting diodes, and a supply substrate for blue light emitting diodes are fabricated, respectively, and by using these supply substrates, one or more red light emitting diodes, one or more green light emitting diodes and one or more blue light emitting diodes can be transferred onto a further supply substrate so as to constitute a set of pixels.

In this way, when producing a light emitting diode display, it is possible to perform collective transferring or transferring in units of one pixel.

Next, several embodiments of the method for producing the light emitting diode supply substrate of the present invention will be specifically described with reference to the drawings.

First Embodiment

Figure 1:
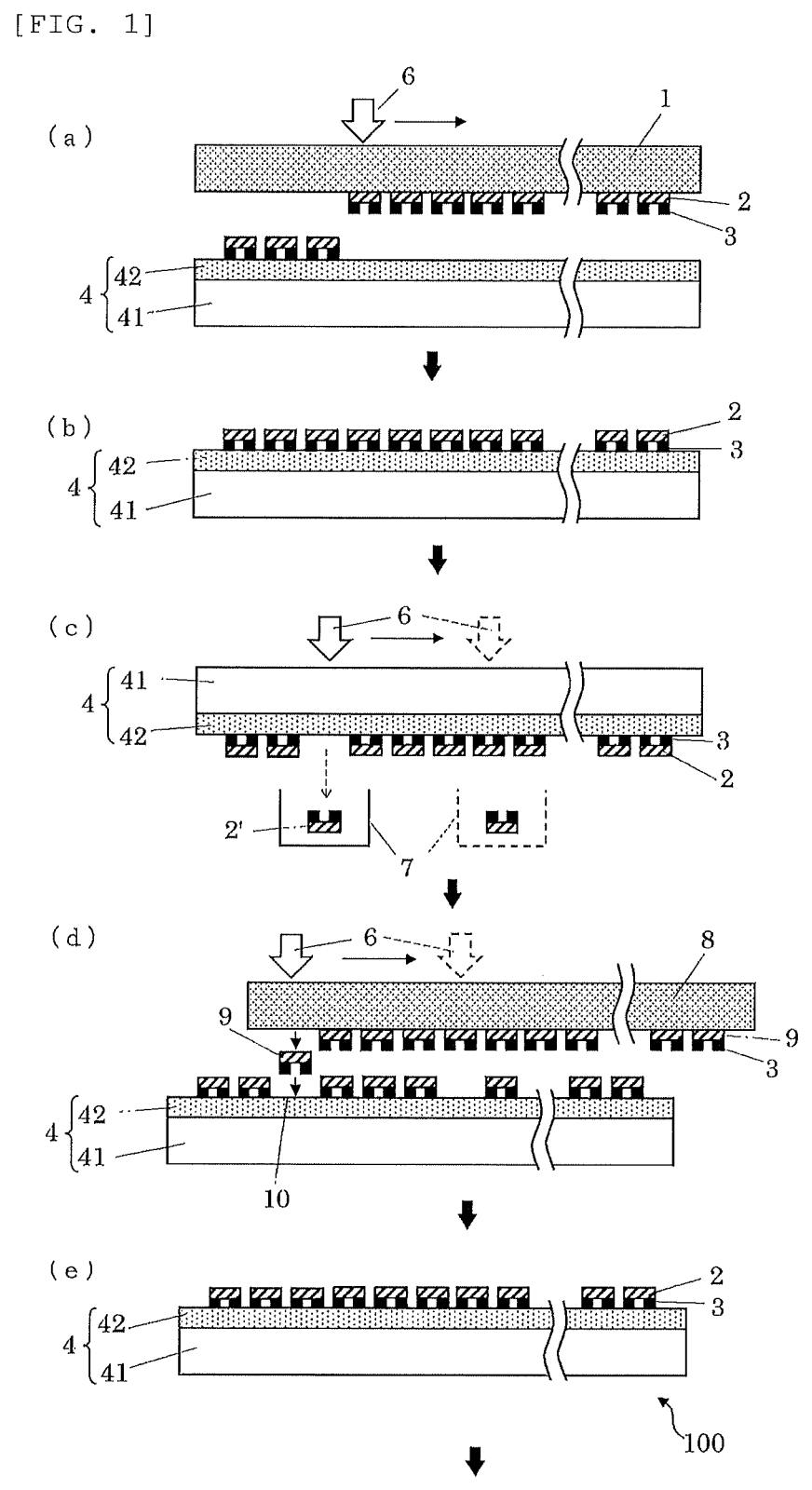

FIGS. 1 and 2 are diagrams explaining the first embodiment of the method for producing a light emitting diode supply substrate of the present invention.

In FIG. 1, "1" is a first sapphire substrate as a starting substrate, "2" is light emitting diodes, which are in a state of being divided after being produced on the starting substrate (first sapphire substrate) 1. "3" denotes electrodes provided on the light emitting diodes 2. "4" is a first supply substrate, which includes a substrate 41 made of a quartz substrate and an adhesive layer 42 formed on one surface thereof. "6" is a laser light. "7" is a container for collecting defective light emitting diodes 2'. "8" is a second sapphire substrate as a supplement substrate. A supplement substrate (second sapphire substrate) 8 is provided with light emitting diodes 9 which are separated from each other and have electrodes 3 formed thereon, similar to the starting substrate 1 of FIG. 1(a). In FIG. 2, "5" is a second supply substrate, which includes a substrate 51 made of quartz substrate and an adhesive layer 52 formed on one surface thereof.

A method for producing a light emitting diode supply substrate according to the first embodiment of the present invention will be described with reference to FIGS. 1 (a) to 1 (e) and FIGS. 2 (f) and 2 (g).

(First Mounting Step)

First, an example of a first mounting step for mounting a plurality of light emitting diodes on a supply substrate will be described with reference to FIG. 1 (a).

As shown in FIG. 1(a), the surface of the first supply substrate 4 on which the adhesive layer 42 is provided and the surface of the starting substrate 1 on which the light emitting diodes 2 are produced are arranged parallel to each other and adjusted so that the in-plane distance is constant. In this state, a laser light 6 is incident on the back surface of the starting substrate 1 (the surface on which the light emitting diodes 2 are not arranged), and the laser light 6 is focused near the interface between the desired light emitting diode 2 and the starting substrate 1. When the light emitting diodes 2 are blue and green light emitting diodes, the GaN layer of the light emitting diodes 2 exists at the interface between the starting substrate 1 and the light emitting diodes 2 fabricated on the starting substrate 1. When laser light 6 reaches this layer, part of the GaN layer is evaporated by laser ablation, and the light emitting diode 2 is separated off from the starting substrate 1. This method is one aspect of laser lift-off method. The light emitting diodes 2 thus separated fly toward the adhesive layer 42 of the first supply substrate 4 facing the light emitting diodes, and are attached and fixed to the adhesive layer 42. As shown in FIG. 1(a), all the light emitting diodes 2 are collectively transferred from the starting substrate 1 to the surface of the adhesive layer 42 of the first supply substrate 4 while moving the laser light 6 along the back surface of the starting substrate 1. FIG. 1(b) shows a state in which all the desired light emitting diodes 2 have been transferred in this manner.

In FIG. 1(a), when the step of collectively transferring a plurality of light emitting diodes in the first mounting step is performed by a laser lift-off method using a CW laser, the transferring is preferably performed in the state where the electrode portions 3 of the light emitting diodes 2 are pressed to the adhesive layer 42 (not shown). In this way, even with a CW laser, it is possible to collectively transfer light emitting diodes by laser lift-off.

(Selective Removal Step)

Next, an example of a step for selectively removing defective light emitting diodes will be described using FIG. 1(c).

First, among the light emitting diodes 2 on the first supply substrate 4, a defective light emitting diode 2' to be removed is selected. This selection can be made, for example, based on the results of the determination step described above.

Next, a laser light 6 is irradiated from the back surface of the first supply substrate 4 (the surface on which the light emitting diodes 2 are not arranged), and defective light emitting diodes 2' adhering to the adhesive layer 42 on the surface of the first supply substrate 4 are irradiated with a laser light 6 so as to selectively remove the defective light emitting diodes 2' by a laser lift-off method. More specifically, in this case, the laser light 6 is focused near the portion where the electrode 3 of the defective light emitting diode 2' and near a part of the defective light emitting diode 2' which are in contact with at least a part of the adhesive layer 42. The irradiation causes a difference between the thermal expansion coefficients of the defective light emitting diode 2' and the electrode 3, and the thermal expansion coefficient of the adhesive layer 42, and shear stress is generated at the interface between them. As a result, the defective light emitting diode 2' and the electrode 3 formed thereon are instantaneously separated off. The separated light emitting diode 2' is captured by a container 7 for collecting defective light emitting diodes. This is also an aspect of laser lift-off method. In this way, by selectively performing the peeling removal operation while moving the irradiation position of the laser light 6 with respect to the defective light emitting diodes 2' to be selectively removed, all of the defective light emitting diodes 2' on the first supply substrate 4 are removed.

As for the position 10 of the defective light emitting diode 2', for example, in the above-described determination step, normal/defective determination may be made in advance on the starting substrate 1, and the position information thereof may be mapped and recorded.

(Second Mounting Step)

Next, with reference to FIG. 1(d), an example of the second mounting step of transferring normal light emitting diodes to the positions where the defective light emitting diodes have been arranged on the supply substrate will be described.

As shown in FIG. 1(*d*), the surface (adhesive layer 42) of the first supply substrate 4 is oriented upward (opposite direction of gravity), and the surface of the supplement substrate (second sapphire substrate) 8 with a surface oriented downward is arranged thereover to arrange them facing each other in parallel at a fixed distance. At the same time, while correcting the rotation of the X-Y axis on the surface of the first supply substrate 4 and the X-Y axis on the surface of the supplement substrate 8, alignment control is performed so that the position of the normal light emitting diode 9 to be supplemented on the supplement substrate 8 and the position (the position where the normal light emitting diode 9 is to be supplemented) 10 where the defective light emitting diode 2' of the first supply substrate 4 has been arranged matches. At the same time, in the Z-axis direction, the distance between the surface of the supplement substrate 8 and the surface of the first supply substrate 4 is adjusted and arranged so as to be the optimum distance. That is, the method for producing the light emitting diode supply substrate of the first embodiment further includes an arrangement step of arranging the supplement substrate 8 so as to face the first supply substrate 4 between the selective removal step and the second mounting step, and in this arrangement step, the position 10 where the defective light emitting diode 2' has been arranged on the first supply substrate 1 and the position of the normal light emitting diode 9 on the supplement substrate 8 are aligned so as to face each other.

Although not specifically illustrated, at least one or both of the stage holding the supplement substrate 8 and the stage holding the first supply substrate 4 have an X-Y movement mechanism, and at least one of them has a rotation correction mechanism, and at least one of the stages has a Z-direction movement mechanism.

Next, after the above-described arrangement step is completed, a laser light 6 is irradiated from the back surface of the supplement substrate 8 toward the normal light emitting diodes 9, and transfer to the light emitting diode defect portion (position where defective light emitting diodes 2' arranged) 10 by the laser lift-off method. This is also one aspect of the laser lift-off method (second mounting step).

By repeating the arrangement step and the second mounting step, it is possible to produce the first light emitting diode supply substrate 100 that does not include any defective light emitting diodes 2' as shown in FIG. 1(*e*).

The position of the normal light emitting diodes 9 may be determined, for example, by making a normal/defective determination on the supplement substrate 8 in advance, and mapping and recording the positional information.

(Reversing Step)

In the state of FIG. 1(*e*), since the electrode 3 side of the light emitting diodes 2 of the first light emitting diode supply substrate 100 faces the adhesive layer 5 side, it is not be used as it is for transfer to the light emitting diode display panel. Therefore, all the light emitting diodes 2 must be turned front and back. The reversing step performed here will be described below.

First, the second supply substrate 5 shown in FIG. 2(*f*) is prepared. Next, as shown in FIG. 2(*f*), an adhesive layer on which the light emitting diodes 2 of the first supply substrate 4 are mounted is placed over the surface (front surface) of the second supply substrate 5 on which the adhesive layer 52 is provided, with the state where the adhesive layer 42 side (surface) facing downwards, so that they face each other in parallel at a constant distance. In this state, a laser lift-off method is performed to cause laser ablation, and all the light emitting diodes 2 on the first supply substrate 4 are turned upside down and transferred to the second supply substrate 5. As a result, a second light emitting diode supply substrate 200 can be produced as shown in FIG. 2(*g*).

Thus, according to the first embodiment of the present invention, it is possible to produce the first and second light emitting diode supply substrates 100 and 200 that do not include defective light emitting diodes 2'.

Next, an example of a method for producing a light emitting diode display using the second light emitting diode supply substrate produced as described above will be schematically described with reference to FIG. 3.

In the example shown in FIG. 3, as shown in FIG. 3(*h*), the light emitting diode supply substrate 200 and the display panel substrate 39 which is the supply destination are arranged so that the positions of the light emitting diodes 2 on the light emitting diode supply substrate 200 and the positions of electrodes of display panel substrate 39 are aligned with each other so as to face each other.

In this state, as shown in FIG. 3(*h*), a plurality of light emitting diodes 2 are collectively transferred and arranged from the second light emitting diode supply substrate 200 to the display panel substrate 39 in the same procedure as described with reference to FIG. 9(IV). By making electrical connections later, a light emitting diode display panel 300 (or light emitting diode display panel as its division unit) including a display panel substrate 39 and a plurality of light emitting diodes 2 arranged on this substrate, as shown in FIG. 3(*i*), can be obtained.

Although not shown, a plurality of light emitting diodes 2 can be collectively transferred and arranged from the second light emitting diode supply substrate 200 to the display panel substrate 39 by using a stamping method.

According to the example of the producing method described above, an assembly operation that does not involve defective light emitting diodes can be realized. By perform this operation for each color of RGB, an RGB color light emitting diode display (light emitting diode display panel) can be manufactured.

Thus, by using the light emitting diode supply substrate that can be produced by the first embodiment of the method for producing a light emitting diode supply substrate of the present invention, it is possible to produce a light emitting diode display with extremely few light emitting defects.

If the step of collectively transferring the light emitting diodes 2 from the second light emitting diode supply substrate 200 to the display panel substrate 39 is performed by laser ablation using the laser lift-off method, the collective transfer can be performed at high speed in a non-contact manner. This makes it possible to practically produce a light emitting diode display 300 with even higher efficiency. Thus, the light emitting diode supply substrate 200 produced by the method for producing the light emitting diode supply substrate of the present invention is very useful for realizing inorganic light emitting diode displays, so-called mini light emitting diode displays and micro light emitting diode displays.

In addition, at the stage of producing the second light emitting diode supply substrate 200, it is preferably produced in a manner that a layout is provided with at least one red light emitting diode, at least one green light emitting diode, and at least one blue light emitting diode in the desired pixel pitch of the display to form a group pf RGB light emitting diodes as one pixel. For this purpose, it is preferably that the first supply substrate 100 of the light emitting diodes 2 for each color of RGB is used, the transfer position to the second supply substrate 5 is controlled for each color to perform the step of arranging the RGB light emitting diodes in the display pitch so as to match the position of the diodes with the electrode position on the display panel substrate 39 side. If the second light emitting diode supply substrate 200 side is produced to have a pixel configuration and a pixel pitch matching the desired display panel substrate 39 in this way, by only collectively transfer the plurality of the light emitting diodes from the second light emitting diode supply substrate 200 onto the display panel substrate 39, the RGB display 300 can be fabricated.

Further, it is preferable that the light emitting diodes 2 are arranged so that the pitch of the arrangement matrix (X-Y) for each color of RGB is the pixel pitch of the display panel or an 1/integral number N of the pixel pitch P.

For that purpose, in the step of transferring the light emitting diodes from the first supply substrate 4 to the second supply substrate 5 or in the step of transferring the light emitting diodes from the starting substrate 1 to the first supply substrate 4 (first mounting step), the light emitting diodes 2 may be transferred to the desired pixel pitch P or P/N pitch positions. Furthermore, when the light emitting diodes 2 are transferred and arranged on the first supply substrate 4 and/or the second supply substrate 5, the arrangement is performed at the pitch (P/N) which is 1/integral number N of the desired pixel pitch P and at the pitch where the light emitting diodes 2 not overlapping each other, the second light emitting diode supply substrate 200 can be produced with the maximum mounting amount corresponding to the desired pixel pitch.

By using the second light emitting diode supply substrate 200 on which the light emitting diodes 2 are mounted at P/N (N: integer) pitch positions in this way, the transfer speed can be remarkably increased when the light emitting diodes 2 are mounted on the display panel substrate 39. That is, when the light emitting diodes are transferred from the second light emitting diode supply substrate 200 to the display panel substrate 39 by the laser lift-off method, the plurality of the light emitting diodes 2 can be collectively (at a time) transferred in the arrangement step including one stage movement by optically moving the laser irradiation position to selectively transfer a light emitting diode on a desired pixel pitch position on the X-Y matrix.

Next, the chip position adjacent to the position of the light emitting diode 2 transferred by the laser lift-off method at this time is moved to the next transfer position (a pitch position of the display panel), and the selective transfer by the laser lift-off method is performed. By repeating this series of operations, it is possible to produce a light emitting diode display panel having light emitting diodes 2 at pixel pitch positions at approximately N times the speed. By sequentially performing the series of operations for the light emitting diode of each color, an RGB light emitting diode display 300 or a display division unit (for example, a light emitting diode display panel) 300 can be produced.

As described above, if the light emitting diode supply substrate having the light emitting diodes arranged in positions suitable for mounting and assembling the light emitting diode to the display in the producing stage of the light emitting diode supply substrate, producing efficiency can be further improved in the producing and assembly process for the display or the division unit of the display.

Here, in the case of collectively transferring the light emitting diodes 2 from the starting substrate 1 shown in FIG. 1 (*a*) to the first supply substrate 4 using the laser lift-off method and in the case of collectively transferring the light emitting diodes 2 from the first supply substrate 4 shown in FIG. 2 (*f*) to the second supply substrate 5, the operation without stage movement is preferable to the operation with stage movement as in a step of removing defective light emitting diodes 2' (FIG. 1 (*c*)) and a second mounting step of normal light emitting diodes 9 (FIG. 1 (*d*)), from the viewpoint of practical time. In such a case, if the transfer is performed by scanning the laser light 6, collective transfer can be performed in a practical time. In that case, the high repetition frequency of the excimer laser is effective. In addition, since a high-output laser light can be obtained, the laser beam spot size is widened to cover a plurality of light emitting diodes 2 instead of individually dividing the irradiation range into individual light emitting diodes 2, so that a group of a plurality of light emitting diodes 2 can be transferred at once. The spot shape may be square or rectangular. By synchronizing the laser light irradiation with the pulse oscillation frequency or an integral multiple thereof, and blocking unnecessary pulse oscillation light with an optical shutter, the light emitting diodes can be efficiently transferred.

Second Embodiment

FIGS. 4 and 5 are diagrams illustrating a method for producing a light emitting diode supply substrate according to the second embodiment of the present invention.

The first embodiment described above, as shown in FIGS. 1 (*c*) and 1 (*d*) was characterized by performing from the step of selectively removing defective light emitting diodes 2' to the second mounting step of transferring normal light emitting diodes 9 on the first supply substrate 4. On the other hand, in the second embodiment shown in FIGS. 4 and 5, it is characterized by performing from a step of selectively removing defective light emitting diodes 2' to a second mounting step of transferring and mounting normal light emitting diodes 9 to the second mounting process on the second supply substrate 5, as shown in FIGS. 5($e_2$) and ($f_2$). Furthermore, the difference is that the substrate for supplying normal light emitting diodes 9 uses the third supply substrate 11 as a supplement substrate. As the third supply substrate 11, for example, a substrate produced in the same manner as the first supply substrate 4 obtained in FIG. 4($b_2$) can be used. Naturally, the result of the normal/defective determination of the light emitting diodes 2 and 9 in advance on the starting substrate 1 and the positional information thereof are transmitted from the starting substrate 1 to the first supply substrate 4 and the third supply substrate 11 is taken over at the time of collective transfer.

Moreover, when the first light emitting diode supply substrate in the state shown in FIG. 1 (*e*) of the first embodiment, that is, in the state where the light emitting diodes 2' determined to be defective have been removed and all the normal light emitting diodes 2 are mounted on the substrate is used as the third supply substrate 11 shown in FIG. 5 ($f_2$) in the second embodiment of the present invention, all the light emitting diodes 2 of the first light emitting diode supply substrate 100 are used without discrimination. As a result, it is possible to improve the efficiency of the arrangement step and the second mounting step on the second supply substrate 5 shown in FIG. 5 ($f_2$).

Third Embodiment

FIG. 6 shows a part of an explanatory diagram of a method for producing a light emitting diode supply substrate according to the third embodiment of the present invention, extracting points different from the second embodiment of the present invention.

FIG. 6 (*f*) is characterized by using a supplement substrate (second sapphire substrate) 8 instead of the third supply substrate 11 in the step of FIG. 5 (f₂) of the second embodiment of the present invention. The illustrated supplement substrate 8 is the same as that shown in FIG. 1 (*d*) of the first embodiment of the present invention.

The second light emitting diode supply substrate 200 shown in FIG. 6 (*g*'), which is obtained by the step of FIG. 6 (*f*), is similar to that shown in FIGS. 2 (*g*) and 5 (g₂).

Fourth Embodiment

In the first to third embodiments, the step of collectively transferring the plurality of light emitting diodes 2 from the starting substrate 1 on which the light emitting diodes 2 have been produced to the first supply substrate 4 is shown in FIGS. 1 (*a*) and 4 (a₂), as the first mounting step. When the light emitting, diodes 2 are blue and green light emitting diodes, this can be achieved because the interface between the starting substrate (sapphire substrate) 8 and the light emitting diodes 2 is a GaN layer. More specifically, the GaN layer at the interface is ablated and N sublimates, so that the light emitting diodes 2 are separated from the starting substrate 8 and ejected. Furthermore, this step for blue and green light emitting diodes can be realized because they have a lateral structure in which the electrodes are formed on the same side.

However, in the case of red diodes, the so-called vertical structure, in which the starting substrate itself is formed on a GaAs substrate and electrodes are formed so as to sandwich the light emitting diode therebetween, has been the mainstream. If this diode is used as it is mounted on a display panel, there is a problem that the electrode connection becomes more complicated because the structure is different from that of blue and green light emitting diodes with lateral structure. In order to overcome this problem, red light emitting diodes with lateral structure have recently been produced and distributed.

FIG. 7 is a part of explanatory diagrams of a method for producing a light emitting diode supply substrate according to the fourth embodiment of the present invention.

In FIG. 7, "21" is a starting substrate (sapphire substrate), and "22" is a red light emitting diode. "23" and "24" are electrodes provided on the light emitting diode, and the electrodes 23 and 24 are connected to conductive layers on opposite surfaces of the red diode 22, respectively. Thus, the electrodes of the red light emitting diode 22 are constructed in a lateral structure. A red light emitting diode 22 is fixed to the starting substrate 21 by an adhesive layer 25. Resin such as BCB (Benzocyclobutene) is generally used for the adhesive layer 25. "4" is a first supply substrate including a substrate 41 and an adhesive layer 42 formed thereon.

In the fourth embodiment, as shown in FIG. 7 (a₄), the starting substrate 21 and the first supply substrate 4 are arranged so as to face each other in parallel, and are adjusted to have a constant distance in the plane. In this state, the adhesive layer 25 is partially ablated by the laser lift-off method, and the red light emitting diode 22 fixed to the starting substrate 21 by the adhesive layer 25 is transferred to the first supply substrate 4.

In this case, since the BCB residue of the adhesive layer 25 remains on the red light emitting diode 22, a wet process or dry process chemical etching is required to remove the BCB residue, although not shown.

Thus, the first supply substrate 4 (FIG. 7 (b₂)) is completed. After this, a second supply substrate 5 free of defective light emitting diodes can be produced, for example, using the method shown in the first or second embodiment of the invention.

The normal/defective determination of the red light emitting diode 22 may be performed by a photoluminescence method while the red light emitting diode 22 is fixed to the starting substrate 1.

As described above, for blue, green and red light emitting diodes, a light emitting diode supply substrate for producing a light emitting diode display can be produced.

Fifth Embodiment

In the first to fourth embodiments, in the first mounting step, the laser lift-off method is used to scan the laser light 6 while providing a certain gap between the starting substrate 1 and the first supply substrate 4 so that the light emitting diodes 2 or 22 of each color are collectively mounted on the first supply substrate 4. In addition, in the collective transfer from the first supply substrate 4 to the second supply substrate 5, a certain gap is provided between both substrates. The advantage in this case is that the same adhesive material can be used for the adhesive layers on the first supply substrate 4 and the second supply substrate 5.

However, collective transfer is possible without necessarily forming a gap.

FIG. 8 is a part of explanatory diagrams of a method for producing a light emitting diode supply substrate according to the fifth embodiment of the present invention. FIG. 8 (a₅₋₁) corresponds to FIG. 1 (*a*), FIG. 8 (a₅₋₂) corresponds to FIG. 7 (a₄), and FIG. 8 (f₅) corresponds to FIG. 2 (*f*).

When the light emitting diodes 2 and 22 are transferred by the laser lift-off method without providing a gap as shown in FIGS. 8 (a₅₋₁), 8 (a₅₋₂) and 8 (f₅), the a little bit pressing is preferable to obtain tacking effect on adhesive layers 42 and 52 in any case.

In the case of FIGS. 8 (a₅₋₁) and 8 (a₅₋₂), since the light emitting diodes 2 and 22 are separated from the starting substrate (sapphire substrate) 1 and the adhesive layer 25, respectively, the above pressing effectively functions.

In the case of FIG. 8 (f₅), the adhesive layer 52 is made of a material having a higher adhesive force (including tack force) than the adhesive layer 42, thereby realizing collective transfer by the laser lift-off method.

Should be noted that other steps in the fifth embodiment may be similar to other steps in the first embodiment or the second embodiment, for example.

By using the second light emitting diode supply substrate 200 produced by the light emitting diode supply substrate producing method according to the second to fourth embodiments, as with the second light emitting diode supply substrate 200 produced by the light emitting diode supply substrate producing method according to the first embodiment, a light emitting diode display (or a light emitting diode display division unit or a light emitting diode display panel) 300 can be produced, for example, according to the procedure shown in FIG. 3.

[Method for Producing Light Emitting Diode Display and Method for Producing Division Unit of Light Emitting Diode Display]

The method for producing the light emitting diode display according to the present invention includes:

a step of producing the light emitting diode supply substrate by the method for producing the light emitting diode supply substrate according to the present invention; and a step of transferring the plurality of light emitting diodes on the light emitting diode supply substrate onto a display panel substrate.

Further, the method for producing the division unit of the light emitting diode display according to the present invention includes:

a step of producing a light emitting diode supply substrate by the method for producing the light emitting diode supply substrate according to the present invention; and a step of transferring the plurality of light emitting diodes on the light emitting diode supply substrate onto a division unit of the light emitting diode display.

In the method for producing a light emitting diode display and the method for producing a division unit of a light emitting diode display of the present invention, the light emitting diode supply substrate is produced by the method for producing a light emitting diode supply substrate of the present invention, and a plurality of light emitting diodes are transferred to the diode display substrate or the division unit of the light emitting diode display, the light emitting diode display or the division unit of the light emitting diode display containing no defective light emitting diodes can be efficiently produced. That is, according to the method for producing the light emitting diode display of the present invention, the light emitting diode display can be produced with high yield. In addition, according to the method for producing the division unit of the light emitting diode display of the present invention, the division unit of the light emitting diode display can be produced with high yield.

It is preferable that the step of transferring the plurality of light emitting diodes on the light emitting diode supply substrate onto the display panel substrate is performed by a laser lift-off method.

By doing so, a plurality of light emitting diodes can be transferred at a higher speed, so a more practical method for produced a light emitting diode display can be provided.

Similarly, the step of transferring the plurality of light emitting diodes on the light emitting diode supply substrate onto the division unit of the light emitting diode display is preferably performed by a laser lift-off method.

By doing so, it is possible to transfer a plurality of light emitting diodes at a higher speed, so that a more practical method for producing a division unit of a light emitting diode display can be provided.

Specific examples of the producing method of the light emitting diode display of the present invention and the producing method of the division unit of the light emitting diode display of the present invention are the examples described with reference to FIGS. 1 to 3.

According to the method for producing a light emitting diode display of the present invention and the method for producing a division unit of a light emitting diode display of the present invention, for example, a large screen display with high resolution and its division unit can be produced. However, according to the method for producing a light emitting diode display of the present invention and the method for producing a division unit of a light emitting diode display of the present invention, by using the light emitting diode supply substrate produced by the method for producing a light emitting diode supply substrate of the present invention, it is possible to provide display function units for wristwatch-sized health care equipment, composite devices, in-vehicle head-up displays and navigation system displays, visual enhancement equipment such as AR/VR/ MR, glasses-type display equipment, and the like. As a result, it is possible to produce and provide electric/electronic equipment having the light emitting diode display or its division unit with a high yield.

[Method for Producing Device Supply Substrate]

A method for producing a device supply substrate for transferring a plurality of devices to a supply destination, including:

a first mounting step for mounting a plurality of devices on a supply substrate;

a selective removal step of selectively removing a defective device on the supply substrate; and a second mounting step of transferring a normal device to a position where the defective device was arranged on the supply substrate.

In the method of producing the light emitting diode supply substrate of the present invention, if a device such as a micro electric device or a micro semiconductor chip is applied in place of the light emitting diode, a device supply substrate that can be used for three-dimensional mounting and electric/electronic equipment can be produced.

By using the device supply substrate thus produced, a plurality of normal devices can be collectively transferred to the supply destination by the laser lift-off method or the stamp method. In other words, according to the method for producing a device supply substrate of the present invention, it is possible to produce a device supply substrate that can collectively transfer a plurality of normal devices to a supply destination. In addition, by selecting a device at a desired position on the device supply substrate produced according to the present invention, a normal device can be transferred to the supply destination by the laser lift-off method. In other words, it is possible to produce a device supply substrate on which normal devices can be transferred regardless of which position is selected.

Then, such a method for producing a device supply substrate can be used, for example, for three-dimensional mounting and production of electrical/electronic equipment.

Micro electric devices include resistors, capacitors, and inductors. Micro semiconductor chips include Si-CMOS semiconductor ICs and LSIs, discrete semiconductors such as diodes, and compound semiconductor chips. MEMS devices such as acceleration sensors can also be handled.

The present invention is not limited to the above embodiments. The above-described embodiments are just examples, and any examples that substantially have the same configuration and demonstrate the same functions and effects as those in the technical concept disclosed in the claims of the present invention are included in the technical scope of the present invention.

The invention claimed is:

1. A method for producing a display panel substrate on which a plurality of light emitting diodes are formed, comprising:

a step A for providing a starting substrate on which the plurality of light emitting diodes are formed via GaN layer, the plurality of light emitting diodes being provided with electrodes on one surface which is on an opposite side of another surface facing the starting substrate;

a step B for providing a first supply substrate including a quartz substrate and an adhesive layer formed on the quartz substrate;

a step C for transferring the plurality of light emitting diodes on the starting substrate onto the first supply substrate by a laser lift-off method;

a step D for selectively removing, by laser light irradiation, a defective light emitting diode among the plurality of light emitting diodes having been transferred onto the first supply substrate;

a step E for re-adhering a normal light emitting diode onto an exposed part of the adhesive layer from which the defective light emitting diode has been removed; and a step F for arranging the plurality of light emitting diodes, in which the defective light emitting diode has been replaced with the normal light emitting diode, on the display panel substrate.

2. The method for producing a display panel substrate according to claim 1, wherein the step F is performed by using a stamping method.

3. The method for producing a display panel substrate according to claim 1, wherein the step F includes:

a step F1 for providing a second supply substrate including a quartz substrate and an adhesive layer formed on the quartz substrate;

a step F2 for transferring the plurality of light emitting diodes, in which the defective light emitting diode has been replaced with the normal light emitting diode, onto the second supply substrate so that the electrode is reversed to face the other side than a side of the adhesive layer; and a step F3 for arranging the plurality of light emitting diodes, which is provided on the second supply substrate, on the display panel substrate.

4. The method for producing a display panel substrate according to claim 1, wherein the method further comprises, before the step D, a step for determining whether each of the plurality of light emitting diodes on the first supply substrate is normal or not.

5. The method for producing a display panel substrate according to claim 1, wherein the adhesive layer of the first supply substrate is made of a pressure-sensitive adhesive containing silicone.

6. The method for producing a display panel substrate according to claim 1, wherein the adhesive layer of the first supply substrate is a silicone resin layer.

7. The method for producing a display panel substrate according to claim 3, wherein the adhesive layer of the second supply substrate has a higher adhesive force than an adhesive force of the adhesive layer of the first supply substrate.

8. The method for producing a display panel substrate according to claim 3, wherein the adhesive layer of the second supply substrate has a higher tack force than a tack force of the adhesive layer of the first supply substrate.

9. The method for producing a display panel substrate according to claim 1, wherein the quartz substrate of the first supply substrate is a synthetic quartz substrate.

10. The method for producing a display panel substrate according to claim 3, wherein the quartz substrate of the second supply substrate is a synthetic quartz substrate.

11. The method for producing a display panel substrate according to claim 1, wherein the quartz substrate of the first supply substrate has an in-plane total thickness variation of 1 $\mu$m or less.

12. The method for producing a display panel substrate according to claim 3, wherein the quartz substrate of the second supply substrate has an in-plane total thickness variation of 1 $\mu$m or less.

13. The method for producing a display panel substrate according to claim 1, wherein the starting substrate on which the plurality of light emitting diodes are formed via the GaN layer includes a sapphire substrate and blue or green light emitting diodes produced on the sapphire substrate.

14. The method for producing a display panel substrate according to claim 1, wherein the display panel substrate is a division unit.

15. A method for producing a light emitting diode display comprising producing the light emitting diode display substrate by the method for producing a display panel substrate according to claim 1.

* * * * *